(12) United States Patent
Jung

(10) Patent No.: US 11,036,426 B2
(45) Date of Patent: Jun. 15, 2021

(54) MEMORY CONTROLLER AND METHOD OF OPERATING THE SAME

(71) Applicant: SK hynix Inc., Icheon-si (KR)

(72) Inventor: Sang Hune Jung, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 33 days.

(21) Appl. No.: 16/734,282

(22) Filed: Jan. 3, 2020

(65) Prior Publication Data

US 2020/0356304 A1 Nov. 12, 2020

(30) Foreign Application Priority Data

May 10, 2019 (KR) .................. 10-2019-0055275

(51) Int. Cl.
*G06F 3/06* (2006.01)
*G06F 1/3225* (2019.01)
*G11C 16/34* (2006.01)

(52) U.S. Cl.
CPC .......... *G06F 3/0658* (2013.01); *G06F 1/3225* (2013.01); *G06F 3/0607* (2013.01); *G06F 3/0611* (2013.01); *G06F 3/0659* (2013.01); *G06F 3/0679* (2013.01); *G11C 16/3404* (2013.01)

(58) Field of Classification Search
CPC .... G06F 3/0611; G06F 3/0659; G06F 3/0607; G06F 3/0658; G06F 3/0679; G06F 1/3225; G06F 1/3206; G11C 16/34; G11C 16/3404

See application file for complete search history.

(56) References Cited

U.S. PATENT DOCUMENTS

2020/0057573 A1 * 2/2020 Nakanishi ........... G06F 12/0804

FOREIGN PATENT DOCUMENTS

| KR | 10-2017-0047468 A | 5/2017 |
| KR | 10-2017-0088268 A | 8/2017 |
| KR | 10-2018-0000281 A | 1/2018 |
| KR | 10-2018-0027710 A | 3/2018 |

* cited by examiner

*Primary Examiner* — Ernest Unelus

(57) ABSTRACT

Provided herein may be a memory controller and a method of operating the same. The memory controller may be configured to control a memory device and include: a request counter configured to generate a count value by counting the number of requests received from a host, and calculate, when the count value matches a preset reference value, an arrival period that is a period between a point in time at which the count value is generated and a point in time at which the count value matches the reference value; a power mode setting component configured to determine an optimal power mode corresponding to the memory device and the memory controller based on the arrival period; and a command controller configured to determine, based on the optimal power mode, points in time at which commands for performing operations corresponding to the respective requests are output.

19 Claims, 20 Drawing Sheets

FIG. 6

| ARV_PERIOD | POWER MODE |
|---|---|
| ARV_PERIOD ≤ D1 | MAX_MODE |
| D1 < ARV_PERIOD ≤ D2 | MID_MODE |
| ARV_PERIOD > D2 | MIN_MODE |

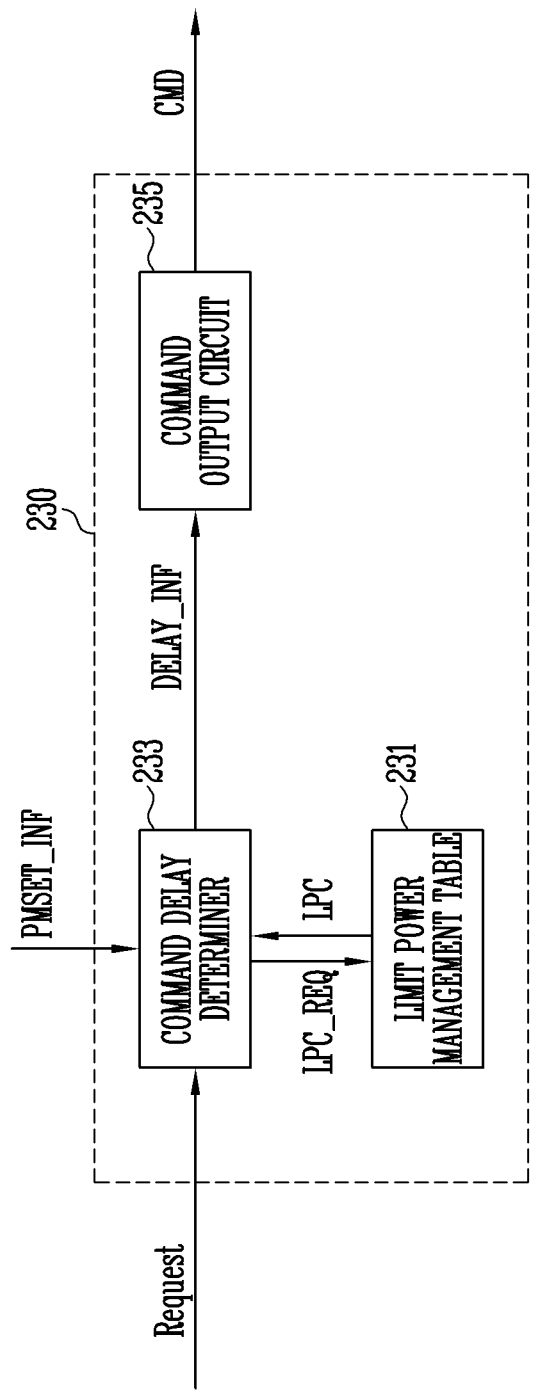

(0 < Δt < tb)

(tb < Δt < ta)

$(-tb < \Delta t < 0)$ $(-ta < \Delta t < -tb)$

MEMORY CONTROLLER AND METHOD OF OPERATING THE SAME

CROSS-REFERENCE TO RELATED APPLICATION

This patent document claims priority under 35 U.S.C. § 119 to the Korean Patent Application No. 10-2019-0055275 filed on May 10, 2019, which is incorporated herein by reference in its entirety, for all purposes.

TECHNICAL FIELD

Various embodiments of the present disclosure generally relate to an electronic device, and more particularly, to a memory controller and a method of operating the memory controller.

BACKGROUND

Generally, a storage device is a device which stores data under the control of a host device such as a computer, a smartphone, or a smartpad. According to the type of device provided to store data, examples of storage devices may be classified into devices such as hard disk drives (HDDs) which store data on a magnetic disk, solid state drives (SSDs), or memory cards which store data in semiconductor memory, and in particular, nonvolatile memory.

A storage device may include a memory device in which data is stored, and a memory controller configured to process or operate on stored data or data to be stored in the memory device. Memory devices may be classified into volatile memories and nonvolatile memories. Representative examples of nonvolatile memories may include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM), by way of non-limiting examples.

SUMMARY

Various embodiments of the present disclosure are directed to memory controllers and to methods of operating memory controllers in which a command may be delayed based on a power consumption limit of a storage device.

An embodiment of the present disclosure may provide for a computer memory storage device with a memory device having computer executable instructions embedded therein and having a memory controller that, when executing commands to control the memory device, performs a method of reducing computer processing time by increasing power consumed by the memory device and the memory controller in executing the commands, the computer memory storage device comprising, a memory controller circuit having, a request counter to count a number of requests received from a host and to calculate an arrival period when the number of requests matches a preset reference value, a power mode setting circuit configured to use the arrival period to select a maximum power mode for the memory device and the memory controller from among a plurality of power modes and a command controller having a limit power management table with the plurality of power modes and determining a delay period for performing one or more of the received requests, wherein the arrival period is a period between a point in time at which counting begins to a point in time at which the number of requests matches the reference value, and wherein the computer memory storage device minimizes the amount of time to process the received requests under the selected power mode.

An embodiment of the present disclosure may provide for computer memory storage device with a memory device having computer executable instructions embedded therein and having a memory controller that, when executing commands to control the memory device, performs a method of reducing computer processing time by increasing power consumed by the memory device and the memory controller in executing the commands, the computer memory storage device comprising, the a memory controller comprising, a power mode setting component configured to receive a power mode setting request for determining an optimal power mode of the memory device and the memory controller from a host, and determine the optimal power mode based on the power mode setting request and a command controller configured to determine, based on the optimal power mode, points in time at which commands for performing operations corresponding to the respective requests received to the memory device from the host are output.

An embodiment of the present disclosure may provide for a method of operating a memory controller configured to control a memory device, the method including: receiving requests from a host, generating a count value by counting the number of requests received from the host, calculating an arrival period that is a period between a point in time at which the count value is generated and a point in time at which the count value matches a preset reference value, determining a highest power mode corresponding to the memory device and the memory controller among a plurality of power modes based on the arrival period and increasing the power consumption to the highest power mode permitted for performing operations corresponding to the respective requests received to the memory device from the host, wherein the computer memory storage device minimizes the amount of time to process the received requests under the selected power mode.

BRIEF DESCRIPTION OF THE DRAWINGS

FIG. 6 is a diagram illustrating a power mode table included in a power mode setting circuit of FIGS. 4 and 5 in accordance with an embodiment of the disclosure.

FIG. 7 is a diagram illustrating the configuration of a command controller of FIGS. 4 and 5 in accordance with an embodiment of the disclosure.

FIG. 8 is a diagram illustrating limits of power consumption included in the limit power management table of FIG. 7 in accordance with an embodiment of the present disclosure.

DETAILED DESCRIPTION

Figure 1:
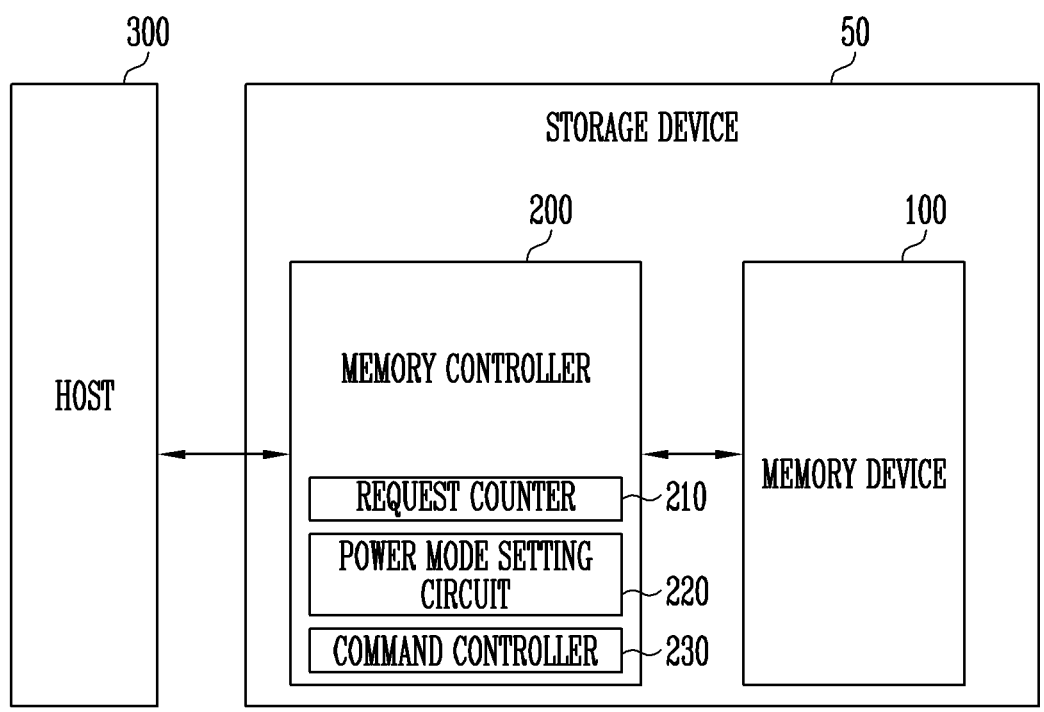
FIG. 1 is a block diagram illustrating a storage device in accordance with an embodiment of the present disclosure.

Specific structural or functional descriptions in embodiments of the present disclosure introduced in this specification or application are only for illustration of the embodiments of the present disclosure. The descriptions should not be construed as limiting the embodiments described in the specification or application.

The present disclosure will now be described in detail based on embodiments. The present disclosure may, however, be embodied in many different forms and should not be construed as being limited to only the embodiments set forth herein, but should be construed as covering modifications, equivalents or alternatives falling within the ideas and technical scopes of the present disclosure. However, it is to be understood that the present description is not intended to limit the present disclosure to those exemplary embodiments, and the present disclosure is intended to cover not only the exemplary embodiments, but also various alternatives, modifications, equivalents and other embodiments that fall within the spirit and scope of the present disclosure.

It will be understood that, although the terms "first", "second", etc. may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present there between. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc., when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art, and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, in which preferred embodiments of the present disclosure are shown, so that those of ordinary skill in the art can easily carry out the technical idea of the present disclosure.

FIG. 1 is a block diagram illustrating a storage device 50 in accordance with an embodiment of the present disclosure.

Referring to FIG. 1, the storage device 50 may include a memory device 100 and a memory controller 200.

The storage device 50 may be a device configured to store data under control of a host 300. Non-limiting examples of devices include a cellular phone, a smartphone, an MP3 player, a laptop computer, a desktop computer, a game machine, a TV, a tablet PC, and an in-vehicle infotainment system.

The storage device 50 may be manufactured as any one of various kinds of storage devices depending on a host interface, which is a communication system for communicating with the host 300. For example, the storage device 50 may be configured of any one of various kinds of storage devices such as an SSD, a multimedia card (MMC), an embedded multimedia card (eMMC), a reduced size-multimedia card (RS-MMC), a micro-MMC type multimedia card, a secure digital (SD), a mini-SD, a micro-SD type card, an universal serial bus (USB) storage device, an universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory controller 200 may control operations of the storage device 50.

When power is applied to the storage device 50, the memory controller 200 may execute firmware (FW). In the case where the memory device 100 is a flash memory device, the memory controller 200 may execute firmware such as a flash translation layer (FTL) for controlling communication between the host 300 and the memory device 100.

In an embodiment, the memory controller 200 may include a request counter 210. The request counter 210 may count requests received from the host 300. For example, each time a request is received from the host 300, the number of times requests have been received may be counted or incremented. Each of the requests received from the host 300 may be any one of a program request, a read request, and an erase request.

The request counter 210 may generate a count value by counting the number of requests received from the host 300. The request counter 210 may increase the count value by "1" each time a request is received from the host 300. In this example, the request counter 210 counts the number of requests by incrementing the count value each time a request is received from the host 300 until the count value reaches a reference value.

When the count value matches the reference value, the request counter 210 may calculate an arrival period. The arrival period may be a period of time between a point in time when the first request is received from host 300 to a point in time at which the count value matches the reference value. An optimal power to be consumed by the memory device 100 and the memory controller 200 may be determined based on the arrival period.

In an embodiment, the memory controller 200 may include a power mode setting circuit 220 that includes a circuit. The power mode setting circuit 220 may determine an optimal power mode for the memory device 100 and the memory controller 200 from among a plurality of power modes using the arrival period. The plurality of power modes may be power modes for determining power consumption limits of the memory device 100 and the memory controller 200. For example, the power mode setting circuit 220 may determine an optimal power mode in which the memory device 100 and the memory controller 200 may be optimally operated. In another example, power mode setting circuit 220 may determine the peak power consumption mode, indicating the maximum power that can be consumed in the memory device 100 and the memory controller 200.

In an embodiment, the memory controller 200 may include a command controller 230. The command controller 230 may receive a request from the host 300. The command controller 230 may output, to the memory device 100, a command CMD for performing an operation corresponding to the request received from the host 300.

The command controller 230 may determine, based on the power mode, points in time at which commands are output. The commands may instruct performance of operations corresponding to respective requests received from the host 300. In other words, the command controller 230 may determine points in time at which the commands for performing the operations corresponding to the respective requests received from the host are output.

The memory device 100 may store data therein. The memory device 100 may operate under the control of the memory controller 200. The memory device 100 may include a memory cell array including a plurality of memory cells configured to store data therein. The memory cell array may include a plurality of memory blocks. Each memory block may include a plurality of memory cells. Each memory block may include a plurality of pages. In an embodiment, each page may be an unit for storing data in the memory device 100 or reading stored data from the memory device 100. Each memory block may also be an unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, for the ease of explanation, it is assumed that the memory device 100 is a NAND flash memory.

In an embodiment, the memory device 100 may be embodied in a three-dimensional array structure such as a flash memory. The present disclosure may be applied to flash memories in which a charge storage layer is formed of a conductive floating gate (FG), and also to a charge trap flash (CTF) memory in which a charge storage layer is formed of an insulating layer.

In an embodiment, each of the memory cells included in the memory device 100 may be formed of a single-level cell (SLC) capable of storing one data bit. Alternatively, each of the memory cells included in the memory device 100 may be formed of a multi-level cell (MLC) capable of storing two data bits, a triple-level cell (TLC) capable of storing three data bits, or a quad-level cell (QLC) capable of storing four data bits.

The memory device 100 may receive a command and an address from the memory controller 200, and access an area of the memory cell array that is selected by the address. In other words, the memory device 100 may perform an operation corresponding to the command on the region selected by the address. For example, the memory device 100 may perform a write (program) operation, a read operation, and an erase operation. During a program operation, the memory device 100 may program data to an area selected by the address. During a read operation, the memory device 100 may read data from the area selected by the address. During an erase operation, the memory device 100 may erase data from the area selected by an address.

The memory device 100 may perform a program operation or an erase operation using a set or predetermined operating voltage under control of the memory controller 200.

In an embodiment, the memory controller 200 may receive data and a logical block address (LBA) from the host 300, and translate the LBA into a physical block address (PBA) indicating addresses of memory cells in the memory device 100 in which data is to be stored. In addition, the memory controller 200 may store, in a buffer memory, mapping information indicating a mapping relationship between the LBA and the PBA.

The memory controller 200 may control the memory device 100 to perform a program operation, a read operation, or an erase operation in response to a request from the host 300. During a program operation, the memory controller 200 may provide a program command, a PBA, and data to the memory device 100. During a read operation, the memory controller 200 may provide a read command and a PBA to the memory device 100. During an erase operation, the memory controller 200 may provide an erase command and a PBA to the memory device 100.

In an embodiment, the memory controller 200 may autonomously or automatically generate a program command, an address and data without receiving a request from the host 300, and transmit the command, address and relevant data to the memory device 100. For example, the memory controller 200 may provide a command, an address and data to the memory device 100 to perform background operations such as a program operation for wear leveling, and a program operation for garbage collection.

In an embodiment, the memory controller 200 may control at least two or more memory devices 100. In this case, the memory controller 200 may control the memory devices 100 in an interleaving or alternating manner so as to enhance operating performance.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
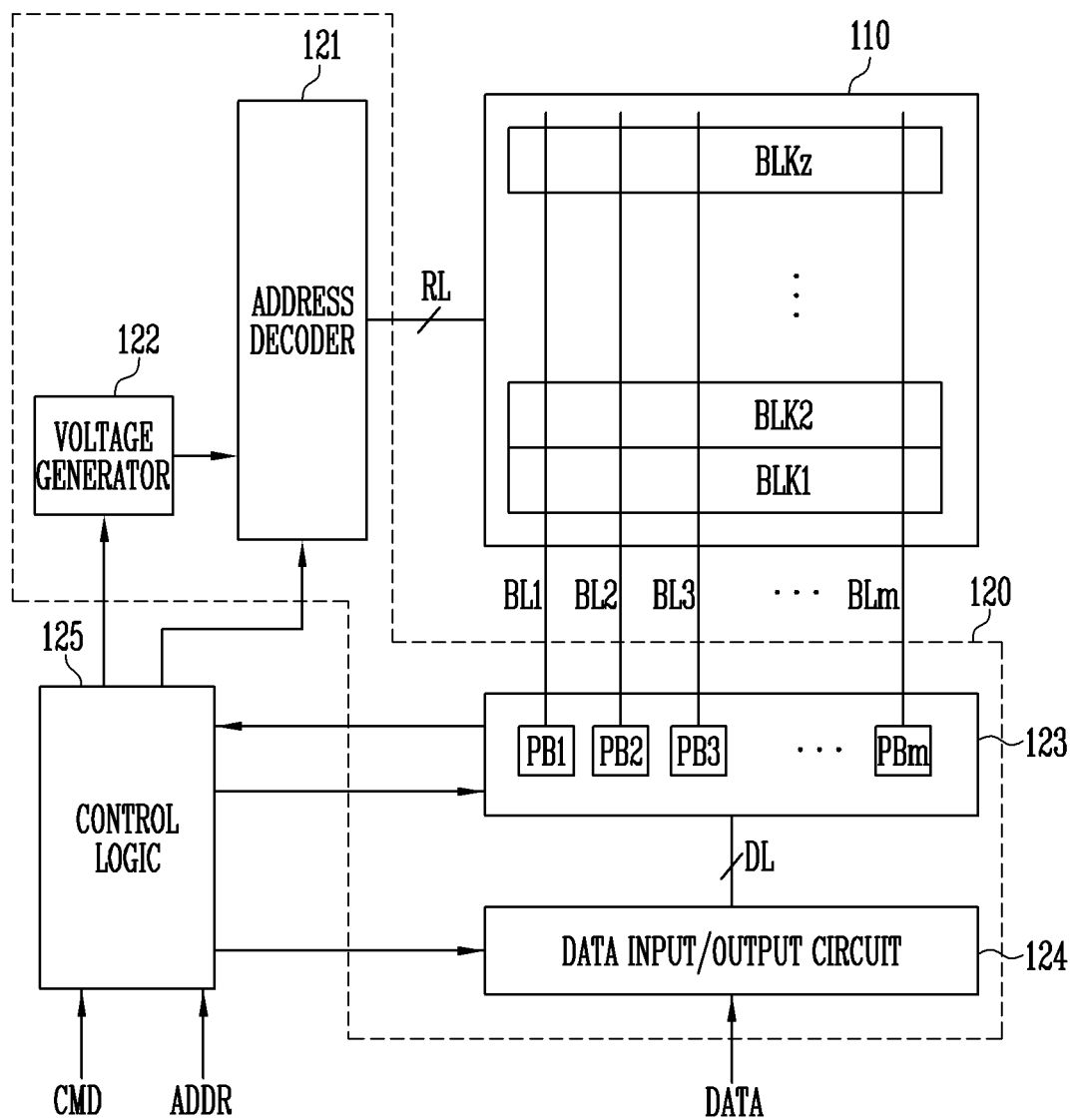
FIG. 2 is a block diagram illustrating a structure of a memory device of FIG. 1 in accordance with an embodiment of the present disclosure.

FIG. 2 is a block diagram illustrating a structure of a memory device of FIG. 1 in accordance with an embodiment of the present disclosure.

Referring to FIG. 2, the memory device 100 may include a memory cell array 110, a peripheral circuit 120, and a control logic 125.

The memory cell array 110 may include a plurality of memory blocks BLK1 to BLKz. The memory blocks BLK1 to BLKz are connected to an address decoder 121 through row lines RL and connected to a read/write circuit 123 through bit lines BL1 to BLm. Each of the memory blocks BLK1 to BLKz may include a plurality of memory cells. In an embodiment, a plurality of memory cells in the memory cell array 110 may be a plurality of nonvolatile memory cells.

The memory cells included in the memory cell array 110 may be divided into a plurality of memory blocks according to the intended application. System information such as various setting information required to control the memory device 100 may be stored in the plurality of memory blocks.

Each of the first to z-th memory blocks BLK1 to BLKz includes a plurality of memory cell strings (not illustrated). First to m-th memory cell strings are respectively coupled to the first to m-th bit lines BL1 to BLm. Each of the first to m-th memory cell strings includes a drain select transistor, a plurality of memory cells coupled in series to each other, and a source select transistor. A drain select transistor DST is coupled to a drain select line DSL.

First to n-th memory cells (not illustrated) of the memory cell array 110 are respectively coupled to first to n-th word lines. A source select transistor SST is coupled to a source select line SSL. A drain of a drain select transistor DST is coupled to a corresponding bit line. The drain select transistors DST of the first to m-th cell strings are respectively coupled to the first to m-th bit lines BL1 to BLm. A source of the source select transistor SST is coupled to a common source line CSL.

In an embodiment, the common source line CSL may be coupled in common to the first to z-th memory blocks BLK1 to BLKz. The drain select line DSL, the first to n-th word lines WL1 to WLn, and the source select line SSL are included in the row lines RL. The drain select line DSL, the first to n-th word lines WL1 to WLn, and the source select line SSL are controlled by the address decoder 121. The common source line CSL is controlled by the control logic 125. The first to m-th bit lines BL1 to BLm are controlled by the read/write circuit 123.

The peripheral circuit 120 may include the address decoder 121, a voltage generator 122, the read/write circuit 123, and a data input/output circuit 124.

The address decoder 121 is coupled to the memory cell array 110 through the row lines RL. The address decoder 121 may operate under the control of the control logic 125. The address decoder 121 receives addresses ADDR through the control logic 125.

In an embodiment, a program operation and a read operation of the memory device 100 may be performed on a page basis.

During the program operation or the read operation, addresses ADDR received from the control logic 125 may include a block address and a row address. The address decoder 121 may decode a block address from among the received addresses ADDR. The address decoder 121 may select a corresponding one of the memory blocks BLK1 to BLKz using or based on the decoded block address. The address decoder 121 may decode a row address among the received addresses ADDR. In response to the decoded row address, the address decoder 121 may apply voltages, provided from the voltage generator 122, to the row lines RL and select one word line of the selected memory block.

During an erase operation, the addresses ADDR may include a block address. The address decoder 121 may decode the block address and select one memory block according to the decoded block address. The erase operation may be performed on the entirety or a portion of one memory block. During a partial erase operation, the addresses ADDR may include block and row addresses. The address decoder 121 may select a corresponding one of the memory blocks BLK1 to BLKz in response to the decoded block address.

For example, the address decoder 121 may decode row addresses among the received addresses ADDR. In response to the decoded row addresses, the address decoder 121 may apply voltages, provided from the voltage generator 122, to the row lines RL and select at least one word line of the selected memory block.

In an embodiment, the address decoder 121 may include a block decoder, a word line decoder, an address buffer, etc.

The voltage generator 122 may generate and supply a plurality of voltages, using an external supply voltage, to the memory device 100. The voltage generator 122 may operate under the control of the control logic 125.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of voltages using the external supply voltage or the internal supply voltage. For example, the voltage generator 122 may include a plurality of pumping capacitors for receiving the internal supply voltage, and generate a plurality of voltages by selectively activating the plurality of pumping capacitors under the control of the control logic 125. The generated voltages are applied to selected word lines by the address decoder 121.

During a program operation, the voltage generator 122 may generate a program pulse having a high voltage and a pass pulse that is lower in voltage level than the program pulse. During a read operation, the voltage generator 122 may generate a read voltage and a pass voltage that is higher than the read voltage. During an erase operation, the voltage generator 122 may generate an erase voltage.

The read/write circuit 123 may include first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm may operate under the control of the control logic 125.

The first to m-th page buffers PB1 to PBm may communicate data with the data input/output circuit 124. During a program operation, the first to m-th page buffers PB1 to PBm may receive data DATA to be stored through the data input/output circuit 124 and data lines DL.

During the program operation, the first to m-th page buffers PB1 to PBm may transmit the data, received through the data input/output circuit 124, to selected memory cells through the bit lines BL1 to BLm when a program pulse is applied to a selected word line. The memory cells in the selected page are programmed based on the transmitted data. A memory cell coupled to a bit line to which a program enable voltage (e.g. a ground voltage) is applied may have an increased threshold voltage. The threshold voltage of a memory cell coupled to a bit line to which a program inhibit voltage (for example, a supply voltage) is applied may be retained. During a program verify operation, the first to m-th page buffers PB1 to PBm may read page data from selected memory cells through the bit lines BL1 to BLm.

During a read operation, the read/write circuit 123 may read data DATA from the memory cells in the selected page through the bit lines BL, and output the read data DATA to the data input/output circuit 124. During an erase operation, the read/write circuit 123 may float the bit lines BL.

In an embodiment, the read/write circuit 123 may include a column select circuit.

The data input/output circuit 124 is coupled to the first to m-th page buffers PB1 to PBm through the data lines DL. The data input/output circuit 124 may operate under control of the control logic 125. During a program operation, the data input/output circuit 124 may receive data to be stored from an external controller (not shown).

The control logic 125 is connected to the address decoder 121, the voltage generator 122, the read/write circuit 123, and the data input/output circuit 124. The control logic 125 may control overall operations of the memory device 100. The control logic 125 may receive a command CMD and addresses ADDR from an external controller. The control logic 125 may control the address decoder 121, the voltage generator 122, the read/write circuit 123, and the data input/output circuit 124 in response to the command CMD.

Figure 3:
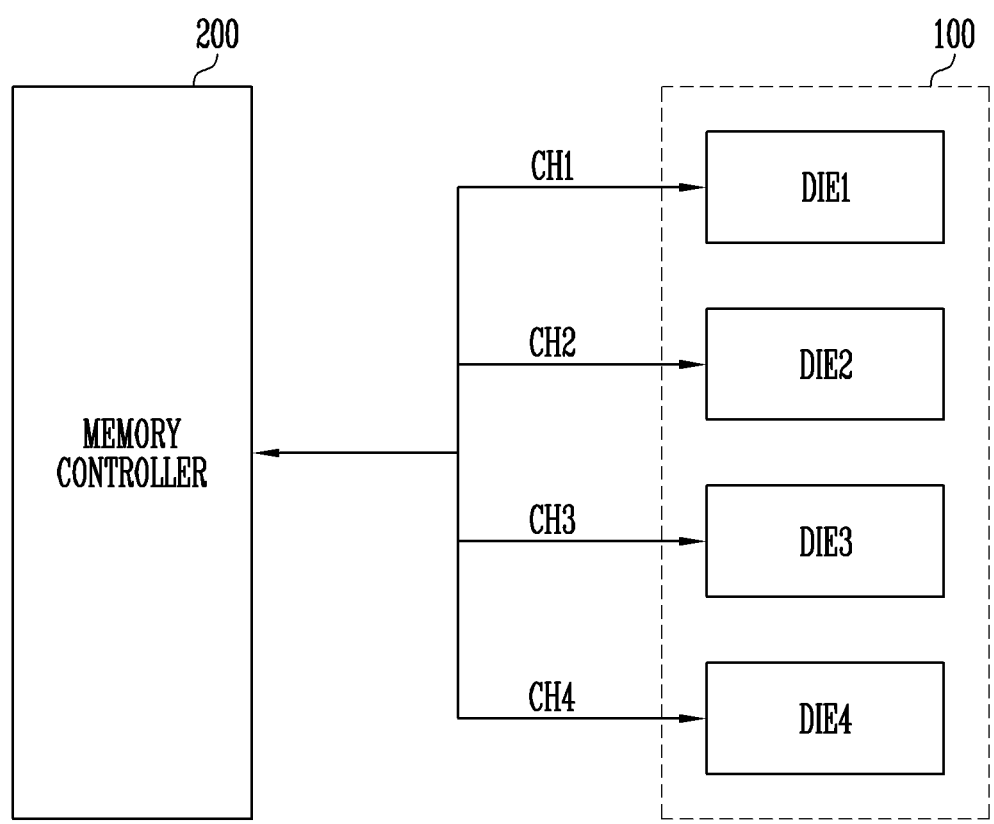
FIG. 3 is a diagram illustrating a plurality of dies included in a memory device of FIG. 1 in accordance with an embodiment of the disclosure.

FIG. 3 is a diagram illustrating a plurality of dies included in a memory device of FIG. 1 according to an embodiment of the present disclosure.

Referring to FIG. 3, the memory device 100 may include first to fourth dies DIE1 to DIE4. The first to fourth dies DIE1 to DIE4 may be coupled to the memory controller 200 through first to fourth channels CH1 to CH4, respectively. Each of the first to fourth dies DIE1 to DIE4 may include a plurality of planes. Each of the plurality of planes may include a plurality of memory blocks. Each of the plurality of memory blocks may include a plurality of pages.

The memory device 100 of FIG. 3 includes the first to fourth dies DIE1 to DIE4, but embodiments contemplated by this disclosure are not limited thereto, and the number of dies included in the memory device 100 may be increased to a greater number.

In an embodiment, the memory device 100 may include a plurality of dies. Operations may be independently performed in each of the plurality of dies. The memory controller 200 may independently control, through the channels CH1 to CH4, respective operations which are performed in the first to fourth dies DIE1 to DIE4.

For example, the memory controller 200 may control the first die DIE1 through the first channel CH1, the second die DIE2 through the second channel CH2, the third die DIE3 through the third channel CH3, and the fourth die DIE4 through the fourth channel CH4. Therefore, the memory controller 200 may output a command CMD, an address, and data to each of the first to fourth dies DIE1 to DIE4 through its corresponding channel so that an operation is performed on the corresponding one of the first to fourth dies DIE1 to DIE4. An operation may be performed on each of the first to fourth dies DIE1 to DIE4, based on a command CMD, an address, and data that are received through the corresponding one of the first to fourth channels CH1 to CH4. The operation which is performed on each of the first to fourth dies DIE1 to DIE4 may be a program (write) operation, a read operation, or an erase operation. Data of the first to fourth dies DIE1 to DIE4 may be transmitted to the memory controller 200 through the first to fourth channels CH1 to CH4, respectively.

Power consumption may be controlled in operations performed on a plurality of dies under control of the memory controller 200. Limit power consumption (LPC) is the peak consumption of power in the memory device 100 and the memory controller 200, and may be preset or predetermined.

The consumption of power used when operations are performed on the first to fourth dies DIE1 to DIE4 cannot exceed the LPC. Hence, the operations performed in the first to fourth dies DIE1 to DIE4 may not be performed in excess of the LPC.

In the conventional art, power consumed in a plurality of dies is maintained below a predetermined level without exceeding the LPC so that the stability of the storage device may be secured. In other words, despite the fact that the LPC of the storage device may be set to a higher level, the LPC is fixed so as to secure the stability of the storage device. Since the LPC is fixed, power consumption of the storage device may not increase to the LPC or more. In other words, in order to keep the LPC relatively low despite high power consumption of a user, the time it takes to perform an operation may be increased. Therefore, there is a need to change the LPC depending on power use or consumption patterns of the user.

Various embodiments of the present disclosure may provide methods of determining the LPC of the memory device 100 and the memory controller 200 based on the power consumption of the user, and methods of determining whether to delay a command CMD for a time period when the power consumption of the memory device 100 and the memory controller 200 exceeds the LPC.

According to the present invention, unlike the prior art, the LPC is determined by user's power consumption pattern. Therefore, the LPC may be higher or lower the conventional LPC. Besides, by performing an operation with higher LPC, the storage device may perform the operation corresponding to a command faster than before and by performing an operation with lower LPC, the storage device may perform the operation corresponding to a command more stable than before.

Figure 4:
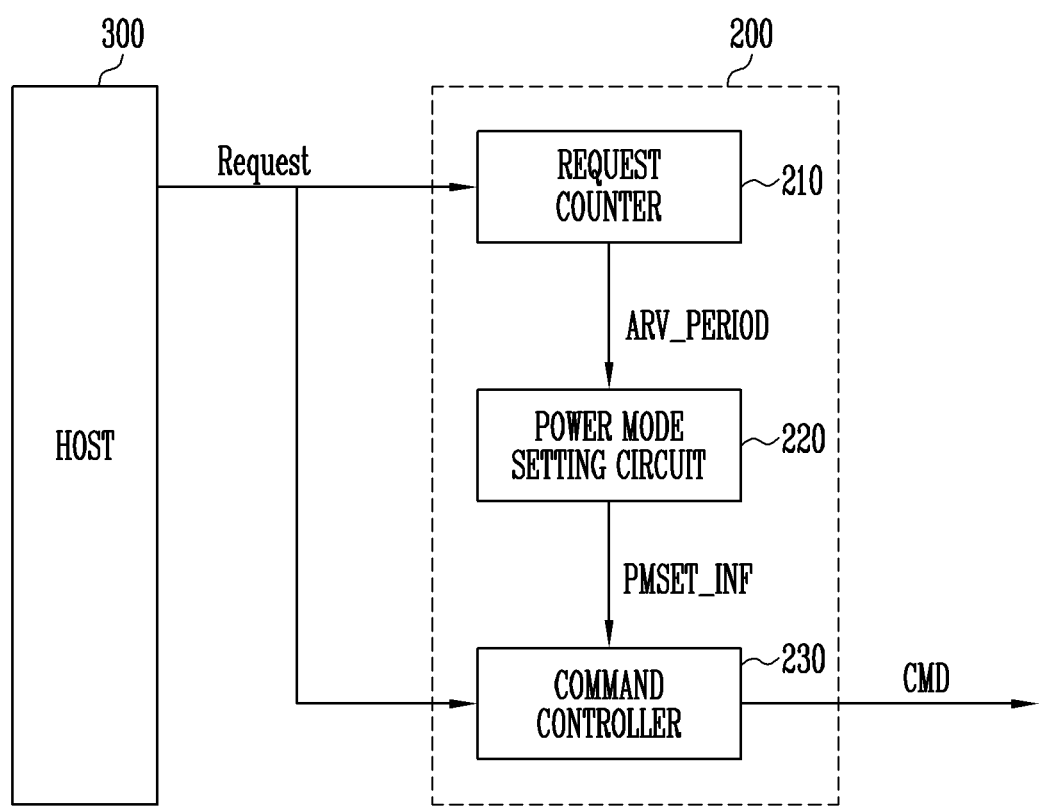
FIG. 4 is a diagram illustrating an embodiment of a configuration of a memory controller of FIG. 1.

FIG. 4 is a diagram illustrating an embodiment of a configuration of a memory controller of FIG. 1.

Referring to FIG. 4, the memory controller 200 may include a request counter 210, a power mode setting circuit 220, and a command controller 230.

The request counter 210 may count requests received from the host 300. A request received from the host 300 may be a program (write) request, a read request, or an erase request. The request counter 210 may count requests received from the host 300 and generate a count value. The count value may be an accumulated value.

In an embodiment, the request counter 210 may receive a plurality of requests from the host 300. Therefore, each time a request is received from the host 300, the request counter 210 may generate a count value increased by "1".

In detail, before a request is received from the host 300, the count value may be initialized to a "0" as a default value. Subsequently, if the request counter 210 receives a request from the host 300, the request counter 210 may count the request received from the host 300 and generate a count value of "1". If the request counter 210 receives a request from the host 300 again, the request counter 210 may increase the count value by "1" to generate a count value of "2".

The request counter 210 may include a preset reference value. The preset reference value may be a value used for determining a pattern of power consumption of the user. For example, the point in time at which the count value counted by the request counter 210 matches the preset reference value may differ depending on a user's power use. In other words, an arrival period (a time period from a point in time at which the count value is generated to a point in time at which the count value matches the preset reference value) may change depending on a particular user's power use.

Since the arrival period ARV_PERIOD varies depending on users' power consumption, there is a need for the LPC of the memory device 100 and the memory controller 200 to be set to different values for different users. The arrival period ARV_PERIOD may therefore refer to a power consumption pattern of the user. In other words, in the case of a user having a short arrival period ARV_PERIOD, the power consumption of the user may be comparatively high. In contrast, in the case of a user having a long arrival period ARV_PERIOD, the power consumption of the user may be comparatively low. Therefore, there is a need for the LPC of a user having a short arrival period ARV_PERIOD to be set to a large value, and for the LPC of a user having a long arrival period ARV_PERIOD to be set to a small value.

If a count value counted by the request counter 210 matches the preset reference value, the request counter 210 may calculate or output an arrival period ARV_PERIOD. The arrival period ARV_PERIOD may be a period between a point in time at which the count value is generated to a point in time at which the count value matches the reference value. The request counter 210 may provide the calculated arrival period ARV_PERIOD to the power mode setting circuit 220.

The power mode setting circuit 220 may determine a power mode for the memory device 100 and the memory controller 200 based on the arrival period ARV_PERIOD. In detail, the power mode setting circuit 220 may receive an arrival period ARV_PERIOD from the request counter 210. The power mode setting circuit 220 may determine a power mode corresponding to the arrival period ARV_PERIOD for the memory device 100 and the memory controller 200.

The power mode setting circuit 220 may include a power mode table which stores arrival periods ARV_PERIOD corresponding to respective power modes, and an LPC corresponding to the peak power consumption of the memory device 100 and the memory controller 200. A power mode determined by the power mode setting circuit 220 may be any one of the plurality of power modes included in the power mode table. As an example, the power mode setting circuit 220 may determine a power mode which is in a section corresponding to an arrival period ARV_PERIOD received from the request counter 210 is an optimal power mode for the memory device 100 and the memory controller 200.

Based on the power mode, the LPC that corresponds to the peak power consumption of the memory device 100 and the memory controller 200 may be determined.

In an embodiment, when the arrival period ARV_PERIOD is relatively long, the power mode setting circuit 220 may determine that a power mode corresponding to lower power consumption is the optimal power mode for the memory device 100 and the memory controller 200, and determines to appropriate the LPC. In contrast, when the arrival period ARV_PERIOD is relatively short or reduced, the power mode setting circuit 220 may determine that a power mode reflecting a higher power consumption is the optimal power mode for the memory device 100 and the memory controller 200, and determines to appropriate the LPC.

The power mode setting circuit 220 may determine the power mode for the memory device 100 and the memory controller 200, and then provide power mode setting information PMSET_INF to the command controller 230. The power mode setting information PMSET_INF may include information about the power mode determined by the power mode setting circuit 220.

The command controller 230 may output a command CMD based on the power mode setting information PMSET_INF. In an example, the command controller 230 may receive a request from the host 300, and output, to the memory device 100, a command CMD for performing an operation corresponding to the request. In this case, the command controller 230 may determine whether to delay a command output time point, for a period of delay time.

In an embodiment, power may be consumed to perform the operation corresponding to the request received from the host 300. The request received from the host 300 may be a request for any one of a plurality of dies included in the memory device 100, or at least two or more of the plurality of dies. As the number of requests received from the host 300 is increased, the power consumption may be increased.

The command controller 230 may determine an LPC of the memory device 100 and the memory controller 200 based on the power mode setting information PMSET_INF.

In other words, the command controller 230 may determine an LPC corresponding to the power mode for each command or operation.

Once the LPC is determined, the command controller 230 may sum power consumption required to perform operations corresponding to the requests received from the host 300. In other words, the command controller 230 may sum power consumption needed for the memory device 100 to perform a plurality the commands. A value obtained by summing the power consumption needed for the memory device 100 to perform the commands may correspond to a summed power consumption.

The command controller 230 may determine an output time point of the command CMD, i.e., whether to delay a command CMD for a delay time, by comparing the summed power consumption with the LPC. If the summed power consumption is equal to or less than the LPC, the command controller 230 may not delay the commands. However, if the summed power consumption is greater than the LPC, any one of the commands to be performed on the memory device 100 may be delayed. The delay time of the command may be a minimum period of time to make a summed power consumption that does not exceed the LPC.

The configuration of the command controller 230 and the operation of determining whether to delay a command CMD for a delay time will be described in more detail below and with reference to FIG. 7.

Figure 5:
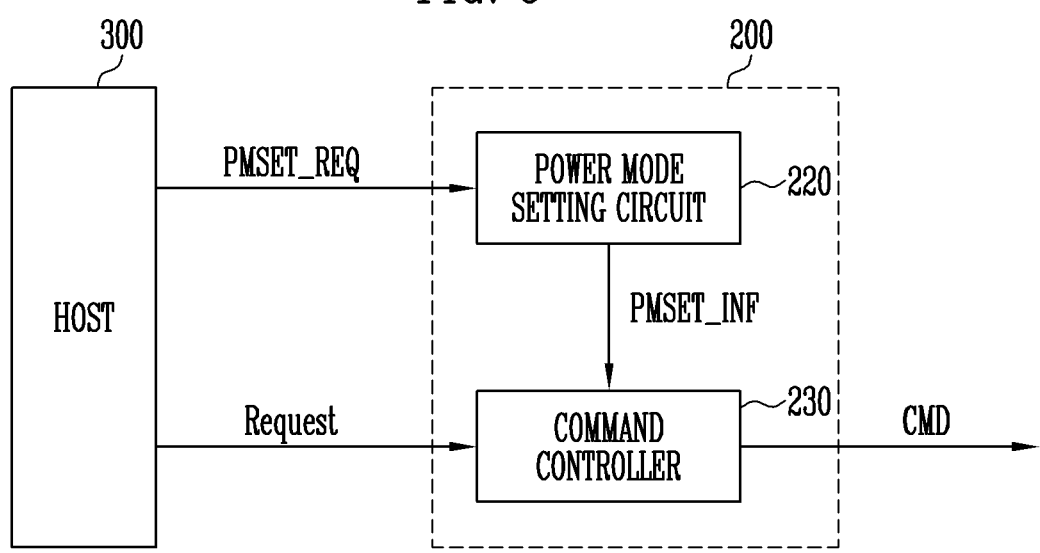
FIG. 5 is a diagram illustrating an embodiment of a configuration of a memory controller of FIG. 1.

FIG. 5 is a diagram illustrating an embodiment of a configuration of a memory controller 200 of FIG. 1.

Referring to FIGS. 4 and 5, a memory controller 200 may include a power mode setting circuit 220 and a command controller 230. For sake of clarity, the request counter 210 is omitted from among the components of the memory controller 200 depicted in FIG. 5.

The power mode setting circuit 220 may receive a power mode setting request PMSET_REQ from the host 300. The power mode setting request PMSET_REQ may be a request for setting the power mode for the memory device 100 and the memory controller 200.

The power mode for the memory device 100 and the memory controller 200 may be set in response to the power mode setting request PMSET_REQ from the host 300. In other words, regardless of the arrival period ARV_PERIOD of FIG. 4, the power mode for the memory device 100 and the memory controller 200 may be set in response to the power mode setting request PMSET_REQ of the host 300. Depending on the power mode, the peak power consumption indicating the maximum power that can be consumed in the memory device 100 and the memory controller 200 may be determined.

In an embodiment, the power mode setting circuit 220 may include a power mode table which stores information about power modes corresponding to respective arrival periods. However, as illustrated in FIG. 5, since the power mode may be determined in response to the power mode setting request PMSET_REQ of the host 300, regardless of the arrival period ARV_PERIOD, the power mode setting circuit 220 may determine that a power mode (corresponding to the power mode setting request PMSET_REQ from the power modes included in the power mode table of the host 300) is an optimal power mode for the memory device 100 and the memory controller 200.

In an embodiment, the power mode setting circuit 220 may receive the power mode setting request PMSET_REQ from the host 300 and set the optimal power mode. Based on the power mode set by the power mode setting circuit 220, the peak power consumption, i.e., the LPC, of the memory device 100 and the memory controller 200 may be determined.

If the power mode is set in response to the power mode setting request PMSET_REQ from the host 300, the power mode setting circuit 220 may provide, to the command controller 230, power mode setting information PMSET_INF including information about the set power mode.

The command controller 230 may output a command CMD based on the power mode setting information PMSET_INF. As an example, the command controller 230 may receive a request from the host 300, and output, to the memory device 100, a command CMD for performing an operation corresponding to the request. Here, the command controller 230 may determine whether to delay a command output time point for a period of time.

The operation of the command controller 230 may determine an LPC corresponding to the power mode based on the power mode setting information PMSET_INF. Thereafter, if the LPC is determined, the command controller 230 may determine whether to delay a command CMD for a period of time by comparing the LPC with a summed power consumption obtained by summing power consumption needed for the memory device 100 to perform multiple commands.

FIG. 6 is a diagram illustrating a power mode table included in the power mode setting circuit 220 of FIGS. 4 and 5 in accordance with an embodiment of the present disclosure.

Referring to FIG. 6, the power mode setting circuit 220 may include a power mode table such as the exemplary table depicted.

In the table of FIG. 6, a first column indicates the arrival period ARV_PERIOD. The arrival period ARV_PERIOD may be a time period between a point in time at which a count value that is counted by the request counter 210 is reset or generated and a point in time at which the count value matches a reference value. The arrival period ARV_PERIOD may be generated by the request counter 210 and provided to the power mode setting circuit 220.

A second column in FIG. 6 indicates the power mode ("POWER MODE"). Depending on the power mode, the peak power consumption (PPC) indicating the maximum power which can be consumed in the memory device 100 and the memory controller 200 may be determined.

In an embodiment, information about power modes corresponding to respective arrival periods may be included in the power mode table. In other words, arrival periods correspond to respective power modes, or an LPC that is the peak power consumption of the memory device and the memory controller, may be stored in the power mode table. Any one of the power modes included in the power mode table may be determined to be the optimal power mode of the memory device 100 and the memory controller 200.

By way of illustration and referring to FIG. 6, the arrival period ARV_PERIOD may be divided into three periods, i.e., below a threshold period D1, between threshold periods D1 and D2, and above threshold period D2. In an embodiment, D1 may be one day and D2 may be ten days. In other embodiments, the number of sections included in the power mode table may be increased. In other words, the power mode setting circuit 220 may subdivide the arrival period ARV_PERIOD into various periods for use in determining the power mode.

Thus, depending on a section to which the arrival period ARV_PERIOD belongs, the power mode POWER MODE of the memory device 100 and the memory controller 200 may be determined.

In an embodiment, when the arrival period ARV_PERIOD is equal to or less than D1 (e.g., ARV_PERIOD is equal to or less than one day), the power mode POWER MODE may be determined to be a maximum power mode MAX_MODE0. In other words, the words "the arrival period ARV_PERIOD is short" or similar phrases may mean that the consumption of power that is used by the user is comparatively high, in "MAX_MODE". Therefore, to make it possible to perform a large number of commands on the memory device 100, the LPC may be set to be a relatively high value. Consequently, when the arrival period ARV_PERIOD is short or reduced, the power mode setting circuit 220 may determine that a power mode for setting the higher power consumption as the LPC is the optimal power mode of the memory device 100 and the memory controller 200.

In the case in which the power mode setting circuit 220 sets the power mode to the maximum power mode MAX_MODE, the number of commands to be performed on the memory device 100 may be increased. In other words, the commands may be simultaneously performed on a plurality of dies included in the memory device 100. Also, a large number of commands may be performed on the memory device 100 without a delaying the commands.

In another embodiment, the arrival period ARV_PERIOD is greater than threshold period D2 (e.g., ARV_PERIOD is greater than ten days), and the power mode may be determined to be a minimum power mode MIN_MODE. In other words, the words "the arrival period ARV_PERIOD is long" or similar phrases may mean that the consumption of power by the user is comparatively low. Therefore, the LPC may be set to a low value so that the number of commands to be performed on the memory device 100 is reduced. Consequently, when the arrival period ARV_PERIOD is increased, the power mode setting circuit 220 may determine that a power mode for setting the lower power consumption as the LPC is the optimal power mode of the memory device 100 and the memory controller 200.

In the case in which the power mode setting circuit 220 sets the power mode to the minimum power mode MIN_MODE, commands may be performed on only some of the plurality of dies included in the memory device 100. Also, commands to be performed on the memory device 100 may be delayed for a period of time.

In a further embodiment, in the case where the arrival period ARV_PERIOD is greater than D1 and equal to or less than D2 (e.g., ARV_PERIOD is greater than one day and equal to or less than ten days), the power mode may be determined to be a middle power mode MID_MODE. If the power mode is determined to be the middle power mode MID_MODE, the LPC may be set to a value greater than the minimum power mode MIN_MODE and less than the maximum power mode MAX_MODE.

In an embodiment, the number of sections or time period divisions included in the power mode table and the number of power modes corresponding to the respective sections may be changed. For example, the section to which an arrival period ARV_PERIOD belongs may be subdivided in various ways, with different divisions corresponding to different POWER MODEs.

FIG. 7 is a diagram illustrating the configuration of the command controller 230 of FIGS. 4 and 5 in accordance with an embodiment of the present disclosure.

Referring to FIG. 7, the command controller 230 may include a limit power management table 231, a command delay determiner 233, and a command output circuit 235.

In an embodiment, the limit power management table 231 may include information about the LPC. As an example, the limit power management table 231 may include information about the LPC corresponding to a power mode ("POWER MODE") determined by the power mode setting circuit 220 of the memory controller 200 of FIGS. 4 and 5. Information about LPCs corresponding to various power modes may be included in the limit power management table 231.

The command delay determiner 233 may receive a Request from the host 300. The Request received from the host 300 may be a program request, a read request, or an erase request. The command delay determiner 233 may determine whether to delay a command CMD for performing an operation corresponding to the Request. The command delay determiner 233 may determine whether to delay the command CMD based on the power mode and the LPC.

The command delay determiner 233 may receive power mode setting information PMSET_INF from the power mode setting circuit 220. The power mode setting information PMSET_INF may include information about the power mode determined by the power mode setting circuit 220. The power mode may determine a peak power consumption (PPC) of the memory device 100 and the memory controller 200.

In an example, the command delay determiner 233 may provide an LPC request LPC_REQ to the limit power management table 231 based on the power mode setting information PMSET_INF. The LPC may be the maximum power that can be consumed in the memory device 100 and the memory controller 200. An LPC corresponding to a power mode in the limit power management table 231 may be provided to the command delay determiner 233.

The command delay determiner 233 may generate, based on the LPC, delay information DELAY_INF about whether to delay any one of the commands, and a time corresponding to the delay.

For instance, the command delay determiner 233 may compare the LPC to a summed power consumption. The summed power consumption may be a power consumption obtained by summing maximum values of power consumption required to perform multiple commands or operation requests. The command delay determiner 233 may compare the LPC and the summed power consumption and thus determine whether to delay at least one of the commands CMD.

In an embodiment, if the summed power consumption obtained by summing the peak power consumption required to perform multiple commands is equal to or less than the LPC, then the command delay determiner 233 may decide to perform all of the commands without delay. In contrast, if the summed power consumption is greater than the LPC, then the command delay determiner 233 may determine to delay at least one of the commands.

In an embodiment, if the summed power consumption exceeds the LPC, at least one of the commands may be delayed so as to prevent the summed power consumption from exceeding the LPC. Therefore, on the assumption that one of the commands is delayed, the command delay determiner 233 may determine the order of commands corresponding to the summed power consumption to include delay times. Further, the command delay determiner 233 may adjust the order of commands corresponding to the summed power consumption to reflect delays.

In an embodiment, if all of the summed power consumption, including power consumption related to a delayed command, exceeds the LPC, then the command delay determiner 233 may determine to delay yet another one of the commands. Subsequently, on the assumption that two of the commands are delayed, the command delay determiner 233 may determine summed power consumption to include both delay times.

In an embodiment, if summed power consumption, including power consumption related to a delayed command, does not exceed the LPC, then a minimum delay time resulting in a summed power consumption not exceeding the LPC may be determined. In other words, commands may be performed as rapidly as possible within a range of time in which the summed power consumption does not exceed the LPC, thereby increasing or optimizing operating speed in relation to power consumption.

The command delay determiner 233 may generate delay information DELAY_INF. In the case in which the command delay determiner 233 has determined not to delay commands, the command delay determiner 233 may generate delay information DELAY_INF including information that the commands are not delayed. On the other hand, if the delay determiner 233 has determined to delay at least one of the commands, then the command delay determiner 233 may generate delay information DELAY_INF including information about commands that have been delayed and a corresponding delay time.

The command delay determiner 233 may provide the delay information DELAY_INF to the command output circuit 235.

The command output circuit 235 may output a command CMD to the memory device 100 based on the delay information DELAY_INF.

In a case in which information that commands are not delayed is included in the delay information DELAY_INF, the command output circuit 235 may simultaneously output the commands. The commands output from the command output circuit 235 may be output to any one of a plurality of dies of memory device 100 through a plurality of respective channels.

On the other hand, in a case in which information that commands are delayed and information about a delay time are included in the delay information DELAY_INF, the command output circuit 235 may delay any one of the commands and output the delayed command. That is, if the summed power consumption exceeds the LPC, when the memory device 100 performs operations corresponding a plurality of commands simultaneously, the command output circuit 235 may sequentially delay any one of the commands.

FIG. 8 is a diagram illustrating LPCs included in the limit power management table 231 of FIG. 7.

Referring to FIG. 8, a first column in FIG. 8 indicates the power mode ("POWER MODE"), and a second column indicates the LPC ("LIMIT POWER CONSUMPTION, LPC"). Depending on the power mode of the first column, the peak power consumption (PPC), i.e., the LPC, indicating the maximum power which can be consumed in the memory device 100 and the memory controller 200, may be determined.

In FIG. 8, it is assumed that a first limit power consumption LPC1 is greater than a second limit power consumption LPC2, and that the second limit power consumption LPC2 is greater than a third limit power consumption LPC3.

In an embodiment, the power mode may be any one of a maximum power mode MAX_MODE, a middle power mode MID_MODE, and a minimum power mode MIN_MODE. The power mode may be determined depending on an arrival period ARV_PERIOD. The arrival period ARV_PERIOD may be calculated when a count value counted by the request counter 210 matches a preset reference value.

The arrival period ARV_PERIOD may be a period between a point in time at which the count value is generated and a point in time at which the count value matches the reference value.

In an embodiment, the power mode may be any one of the power modes included in the power mode table of FIG. 6. In other embodiments, if the arrival period ARV_PERIOD is further subdivided, and the number of levels included in the power mode table is increased, then the power mode may be any one of a plurality of power modes corresponding to a larger number of sections or levels.

In an embodiment, if the power mode is determined to be the maximum power mode MAX_MODE, then the LPC may correspond to the first limit power consumption LPC1.

In an embodiment, if a result of the arrival period ARV_PERIOD calculation indicates that the arrival period ARV_PERIOD is relatively short, then the power mode POWER MODE may be determined to correspond to the maximum power mode MAX_MODE. Under such circumstances, the peak power consumption, i.e., the LPC, of the memory device 100 and the memory controller 200 is set to a relatively high value.

The words "the arrival period ARV_PERIOD is short (or relatively short)" means that the power consumption of the memory device 100 and the memory controller 200 is relatively high. Hence, in this case, there is a need to set the LPC to a relatively high value. If the LPC is set to a high value, then the power capacity in the memory device 100 and the memory controller 200 is increased. Thus, the operating speed may be increased, and the time it takes to perform operations or commands may be reduced.

If the arrival period is short, then the power mode ("POWER MODE") in FIG. 6 may be determined to be the maximum power mode MAX_MODE. If the power mode is determined to be the maximum power mode MAX_MODE, then the first limit power consumption LPC1 corresponding to the maximum power mode MAX_MODE may be set as the LPC. Therefore, the memory device 100 and the memory controller 200 may consume power within a range defined by the first limit power consumption LPC1.

In an embodiment, if the power mode is determined to be the minimum power mode MIN_MODE, then the LPC may be determined to be the third limit power consumption LPC3.

When the arrival period ("ARV_PERIOD") is calculated and determined to be long or relatively long (e.g., ARV_PERIOD is greater than ten days), then the corresponding power mode may be determined to be a minimum power mode MIN_MODE. Where the arrival period ARV_PERIOD is determined to be long, there is a need to set the peak power consumption (i.e., the LPC) of the memory device 100 and the memory controller 200 to a relatively low value.

The words "the arrival period ARV_PERIOD is long (or relatively long)" means that the power consumption of the memory device 100 and the memory controller 200 is relatively low. Hence, in this case, there is a need to set the LPC to a relatively low value. If the LPC is set to a low value, then the power consumption of the memory device 100 and the memory controller 200 may be prevented from rapidly increasing, and may be operated in a low power mode, whereby the operation reliability thereof may be enhanced. If the LPC may be set a relatively low value, the total power consumption may not increase or decrease rapidly. That is, the probability of error operation due to excessive or insufficient power consumption may be reduced.

If there is a need to set the peak power consumption of the memory device 100 and the memory controller 200 to a low value, then the power mode may be determined to be the minimum power mode MIN_MODE. If the power mode is determined to be the minimum power mode MIN_MODE, then the third limit power consumption LPC3 corresponding to the minimum power mode MIN_MODE may be set as the LPC. Therefore, the memory device 100 and the memory controller 200 may consume power within a range defined by the third limit power consumption LPC3.

In an embodiment, where the power mode is determined to be the middle power mode MID_MODE, the LPC may correspond to be the second limit power consumption LPC2.

When a result of calculating the arrival period ARV_PERIOD indicates that the arrival period ARV_PERIOD is a period included in a specific section (e.g., ARV_PERIOD is greater than one day and equal to or less than ten days), the power mode ("POWER MODE") may be determined to be the middle power mode MID_MODE. If the arrival period ARV_PERIOD is determined to be a period included in the specific section, then the peak power consumption, i.e., the LPC, of the memory device 100 and the memory controller 200 is set to a middle value.

If the power mode is determined to be the middle power mode MID_MODE, then the second limit power consumption LPC2 corresponding to the middle power mode MID_MODE may be set as the LPC. In other words, if the power mode POWER MODE is the middle power mode MID_MODE, then the second limit power consumption LPC2, which is less than the first limit power consumption LPC1 corresponding to the maximum power mode MAX_MODE and greater than the third limit power consumption LPC3 corresponding to the minimum power mode MIN_MODE, may be determined to be the LPC. Therefore, the memory device 100 and the memory controller 200 may consume power within a range defined by the second limit power consumption LPC2.

Figure 9A:
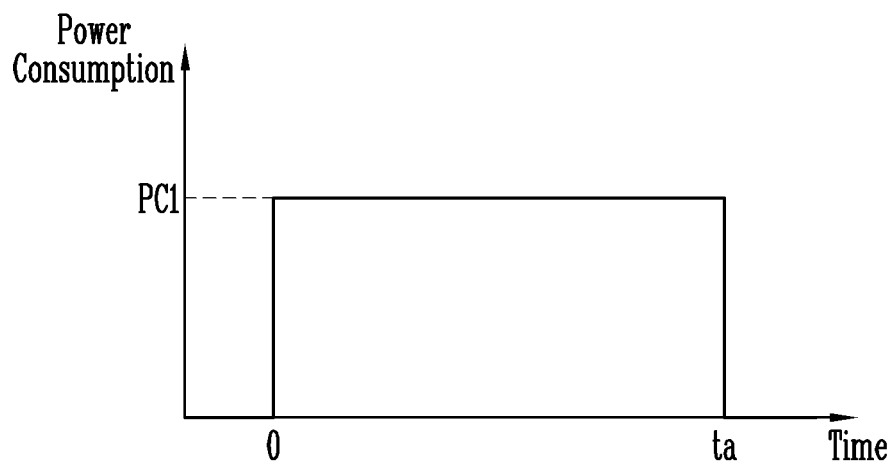
FIGS. 9A to 9C are diagrams illustrating subdivisions of power consumption required to perform a command, in accordance with an embodiment of the present disclosure.
Figure 9B:
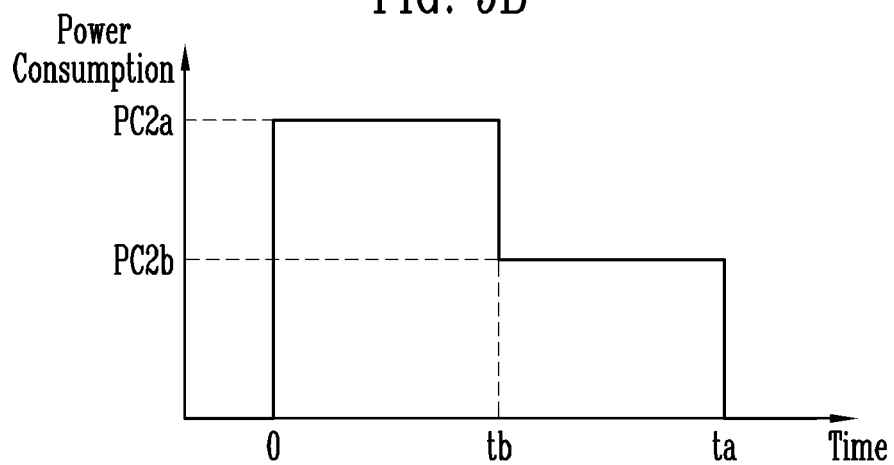
Figure 9C:
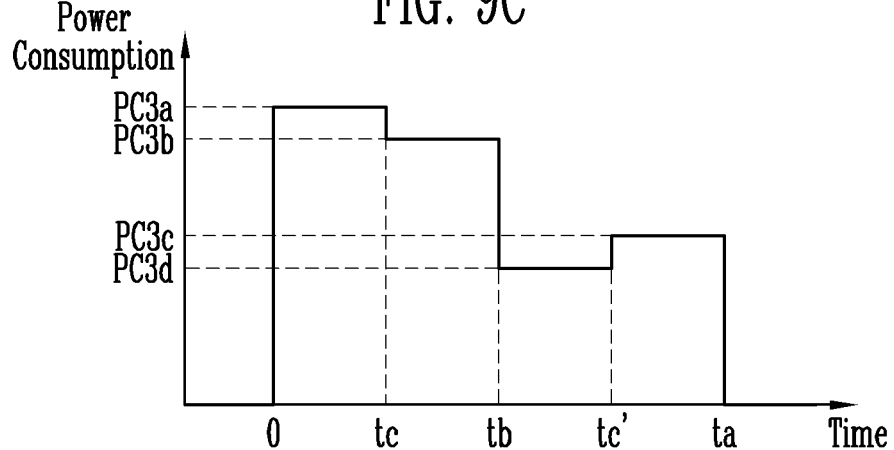

FIGS. 9A to 9C are diagrams illustrating subdivisions of power consumption required to perform a command, in accordance with an embodiment of the present disclosure.

FIGS. 9A to 9C illustrate power consumption for a command by a storage device in different power modes. FIG. 9A illustrates the power consumption in a minimum power mode such as MIN_MODE; FIG. 9B illustrates the power consumption in the middle power mode such as MID_MODE: and FIG. 9C illustrates the power consumption in the maximum power mode such as MAX_MODE.

In FIGS. 9A to 9C, the horizontal axis indicates the time during which a command is performed, and the vertical axis indicates power consumption as a function of time. In FIGS. 9A to 9C, the power consumption may be power consumption levels over a period of time, or total power consumption over a period of time.

In an embodiment, the information reflected in FIGS. 9A to 9C may be provided to the command controller 230 of FIGS. 4 and 5. For example, optimal power modes to perform a command may be provided to the command controller 230. Furthermore, the power consumption limits for a power mode for executing commands may be provided by the command controller 230. A command may instruct a memory device to perform a program operation, a read operation, or an erase operation.

FIGS. 9A to 9C illustrate power consumption for a command according to various power modes. In an embodiment, power consumption for a power mode, as determined by commands, are illustrated.

In FIG. 9A, a command to be performed on the memory device 100 is performed during a period between 0 and ta, and the power consumption during the period between 0 and ta may be PC1. In FIG. 9B, a command to be performed on the memory device 100 is performed during a period between 0 and ta, and the power consumption during the period between 0 and tb may be PC2a, while the power consumption during the period between tb and ta may be PC2b. In FIG. 9C, a command to be performed on the memory device 100 is performed during a period between 0 and ta. The power consumption during a period between 0 and tc may be PC3a, the power consumption during a period between tc and tb may be PC3b, and the power consumption during a period between tb and tc' may be PC3d, and the power consumption during a period between tc' and ta may be PC3c.

Referring to FIGS. 9A to 9C, PC1 may be an average value of PC2a and PC2b. PC1 may be subdivided into PC2a and PC2b. In other words, FIG. 9B is a diagram illustrating a division of the power consumption of FIG. 9A over time. Throughout the specification, power consumption may be expressed as a power level or total power consumed over the period.

Likewise, PC2a may be an average value of PC3a and PC3b. PC2b may be an average value of PC3c and PC3d. In other words, PC2a may be subdivided into PC3a and PC3b, and PC2b may be subdivided into PC3c and PC3d. Hence, FIG. 9C is a diagram illustrating division of the power consumption over time illustrated in FIG. 9B.

The degree to which the power consumption is subdivided may be increased in a sequence from FIG. 9A to FIG. 9C. In other words, the degree to which the power consumption is subdivided may be increased sequentially from the minimum power mode MIN_MODE to the maximum power mode MAX_MODE. In the case where the power consumption is subdivided, a delay time for which the command is delayed may be reduced. That is, because a time of delay is determined based on a subdivided power consumption, the delay time may be reduced.

In detail, depending on a result of comparing the LPC and a summed power consumption, a command controller 230 determines whether to delay at least one of commands, and if so, a delay time. The summed power consumption may be a power consumption obtained by summing peak power consumption required to perform each command. In a case in which the power consumption is not subdivided, a command determined to be delayed may be performed after commands other than the command determined to be delayed have been completely performed. In other words, a point in time at which the command determined to be delayed is performed may be determined to be a point in time at which the other commands are completed.

If the power consumption is subdivided, the summed power consumption may be calculated for each time section. That is, in FIG. 9B and FIG. 9C, the time is subdivided, the summed power consumption may be calculated corresponding each time section. The command controller 230 may determine a delay time among time sections at each power mode. Therefore, the delay time may be reduced from FIG. 9A to FIG. 9C.

In the case of FIG. 9A, since the power consumption is not subdivided, the maximum value of the summed power consumption is not changed even when a command is delayed. In other words, since the memory device 100 and the memory controller 200 are operated in the minimum power mode MIN_MODE, the command determined to be delayed may be performed if the commands other than the command determined to be delayed are completely performed. Consequently, the command determined to be delayed may be performed without advancing a delay time of the command by subdividing the power consumption.

FIG. 9B is a diagram illustrating subdivision of the power consumption of FIG. 9A. FIG. 9C is a diagram illustrating subdivision of the power consumption of FIG. 9B. If the summed power consumption obtained by summing the peak power consumption among the power consumption required to perform the commands is greater than the LPC, as determined by memory controller 230, then at least one of the commands may be determined to be delayed.

Here, refer to FIGS. 9B and 9C when at least one of the commands is delayed, delay time may be determined. A minimum delay time resulting in a summed power consumption not exceeding the LPC may be determined from the delay times. The delay time may be determined in a period between 0 and ta.

Figure 10A:
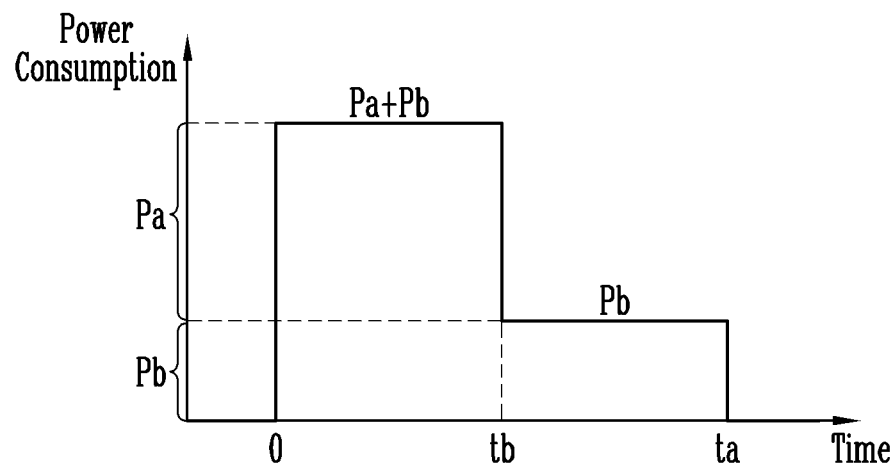
FIGS. 10A and 10B are diagrams illustrating power consumption required to perform a command in a middle power mode, in accordance with an embodiment of the present disclosure.
Figure 10B:
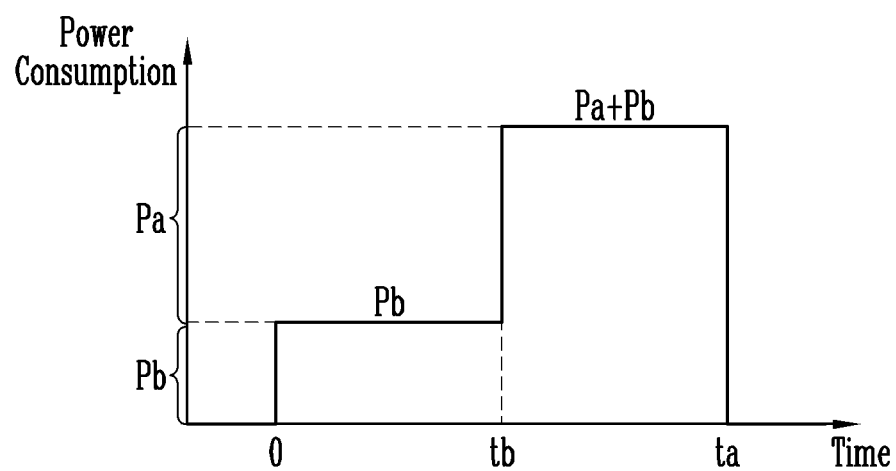

FIGS. 10A and 10B are diagrams illustrating power consumption required to perform commands in the middle power mode, in accordance with an embodiment of the present disclosure.

More specifically, FIGS. 10A and 10B are diagrams illustrating power consumption required to perform different commands when the power mode is the middle power mode MID_MODE. In FIGS. 10A and 10B, the horizontal axis indicates the time for which a command is performed, and the vertical axis indicates the power consumption as a function of time.

FIGS. 10A and 10B illustrate power consumption required to perform different commands in the middle power mode MID_MODE, i.e., in one power mode. It is assumed that FIG. 10A illustrates a power consumption required to perform a first command, and FIG. 10B illustrates a power consumption required to perform a second command. The number of commands to be performed on the memory device 100 are not limited in embodiments contemplated by this disclosure, and the number of commands may be increased without limitation.

In an embodiment, power consumption used to perform a plurality of commands may be changed in various ways. Also, a power consumption for each command may be changed as a function of time.

In FIG. 10A, a power consumption in a period between 0 and tb may be Pa+Pb, and a power consumption in a period between tb and ta may be Pb. In FIG. 10B, a power consumption in a period between 0 and tb may be Pb, and a power consumption in a period between tb and ta may be Pa+Pb.

Referring to FIGS. 8, 10A and 10B, since an operation mode for the memory device 100 and the memory controller 200 has been determined to be the middle power mode MID_MODE, the LPC may be determined to be the second limit power consumption LPC2. Therefore, the power consumption of the memory device 100 and the memory controller 200 cannot exceed the second limit power consumption LPC2. If the power consumption of each command exceeds LPC2, any one of commands may be delayed.

In an embodiment, if first and second commands are simultaneously performed, then the power consumption required to perform the first and second commands is required to be equal to or less than the second limit power consumption LPC2. In the case where the summed power consumption required to perform the first and second commands is equal to or less than the second limit power consumption LPC2, the first and second commands may be simultaneously performed. However, in the case where the summed power consumption required to perform the first and second commands exceeds the second limit power consumption LPC2, any one of the first and second commands may be delayed.

In the case where the power consumption required to perform the first and second commands exceeds the second limit power consumption LPC2, the first or second commands may be determined to be delayed. If any one of the first and second commands may be determined to be delayed, a delay time may be determined based on power consumption summed by respective delay times. In other words, a minimum delay time generating a summed power consumption not exceeding the LPC may be determined.

A method of determining the minimum delay time will be described in detail with reference to FIGS. 11 to 13.

Figure 11A:
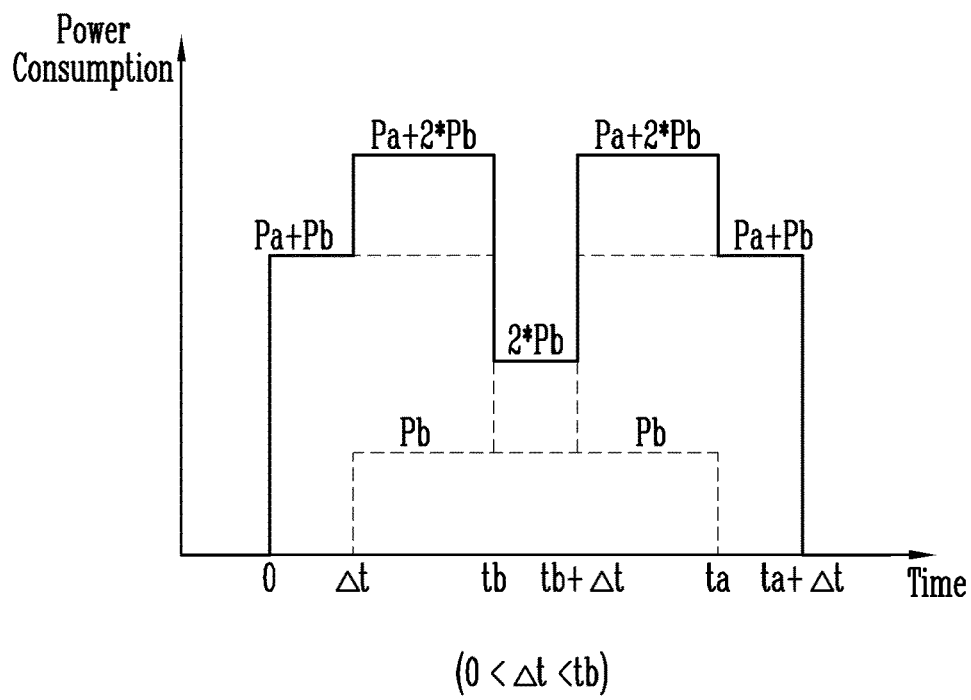
FIGS. 11A and 11B are diagrams illustrating power consumption when a command in FIG. 10B is delayed in accordance with an embodiment of the present disclosure.
Figure 11B:
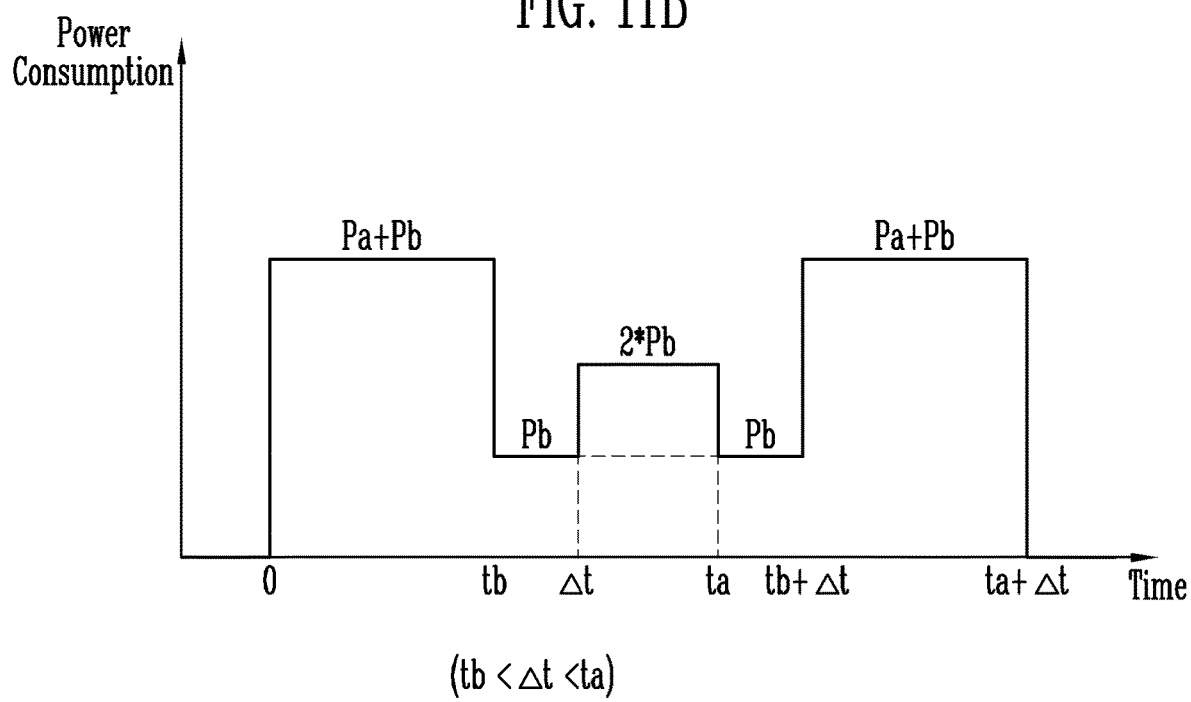

FIGS. 11A and 11B are diagrams illustrating power consumption when a command in FIG. 10B is delayed in accordance with an embodiment of the present disclosure.

Referring to FIGS. 10A, 10B, 11A, and 11B, FIGS. 11A and 11B illustrate a summed power consumption obtained by summing power consumption required to perform the first and the second commands after a command of FIG. 10B, i.e., the second command, has been delayed because the power consumption exceeds the LPC. In FIGS. 11A and 11B, a delay time $\Delta t$ of the second command of FIG. 10B may be greater than 0 and less than ta. In FIGS. 11A and 11B, the horizontal axis indicates the time for which a command is performed, and the vertical axis indicates the power consumption as a function of time.

Referring to FIGS. 10A, 10B, 11A, and 11B, FIGS. 11A and 11B illustrate a summed power consumption obtained by summing the power consumption required to perform the first command and the power consumption required when the second command is delayed. FIG. 11A illustrates the case where the delay time $\Delta t$ of the second command is greater than 0 and less than tb. FIG. 11B illustrates the case where the delay time $\Delta t$ of the second command is greater than tb and less than ta.

The delay time $\Delta t$ of the second command cannot exceed ta. In other words, if the delay time $\Delta t$ of the second command exceeds ta, then the delay time $\Delta t$ cannot be reduced because the second command is performed after the first command has been performed. Given this, it is assumed that the delay time $\Delta t$ does not exceed ta.

In an embodiment, the power consumption in a period between 0 and $\Delta t$ of FIG. 11A may be Pa+Pb. In other words, since the second command has been delayed, the power consumption in the period between 0 and $\Delta t$ may be at least a power consumption required to perform the first command between 0 and tb.

In FIG. 11A, a power consumption in a period between $\Delta t$ and ta may be a power consumption required to perform the first and second commands. In other words, the power consumption in the period between $\Delta t$ and ta may be a power consumption required to perform the first and second commands after the delay time $\Delta t$ has passed.

Referring to FIGS. 10A, 10B and 11A, a power consumption in a period between $\Delta t$ and tb may be Pa+2*Pb, a power consumption in a period between tb and tb+$\Delta t$ may be 2*Pb, and a power consumption in a period between tb+$\Delta t$ and ta may be Pa+2*Pb. In other words, the power consumption required in the period between $\Delta t$ and tb may be Pa+2*Pb obtained by summing the power consumption Pa+Pb required to perform the first command and the power consumption Pb required to perform the second command in FIGS. 10A and 10B. The power consumption required in the period between tb and tb+$\Delta t$ may be 2*Pb obtained by summing the power consumption Pb required to perform the first command and the power consumption Pb required to perform the second command. The power consumption required in the period between tb+Δt and ta may be Pa+2*Pb obtained by summing the power consumption Pb required to perform the first command and the power consumption Pa+Pb required to perform the second command.

The power consumption required in the period between ta and ta+Δt of FIG. 11A may be Pa+Pb. In other words, since the second command has been delayed, the power consumption in the period between ta and ta+Δt may be a power consumption required to perform the second command in FIG. 10B.

Consequently, in the case where the delay time Δt of the second command is greater than 0 and less than tb, the peak power consumption may be Pa+2*Pb.

In an embodiment, a power consumption required in a period between 0 and tb of FIG. 11B may be Pa+Pb, and a power consumption required in a period between tb to Δt may be Pb. In other words, since the second command has been delayed and Δt is greater than tb, the power consumption in the period between 0 and Δt may be a power consumption required to perform the first command in FIG. 10A.

In FIG. 11B, the power consumption in a period between Δt and ta may be a power consumption required to perform the first and second commands. In other words, the power consumption in the period between Δt and ta may be a power consumption required to perform the first and second commands after the delay time Δt has passed when Δt is greater than tb. Referring to FIGS. 10A and 10B, the power consumption required in the period between Δt and ta may be 2*Pb obtained by summing the power consumption Pb required to perform the first command and the power consumption Pb required to perform the second command.

In an embodiment, a power consumption required to perform the delayed command of FIG. 10B in a period between ta and tb+Δt of FIG. 11B may be Pb, and a power consumption required in a period between tb+Δt and ta+Δt may be Pa+Pb. In other words, since the second command has been delayed, the power consumption in the period between ta and ta+Δt may be a power consumption required to perform the second command.

Consequently, in the case where the delay time Δt of the second command is greater than tb and less than ta, the peak power consumption may be Pa+Pb.

FIGS. 11A and 11B illustrate power consumption when a command of FIG. 10B, i.e., the second command, is delayed. Therefore, when the delay time Δt of the second command is greater than 0 and less than tb, the peak power consumption may be Pa+2*Pb. When the delay time Δt of the second command is greater than tb and less than ta, the peak power consumption may be Pa+Pb.

Figure 12A:
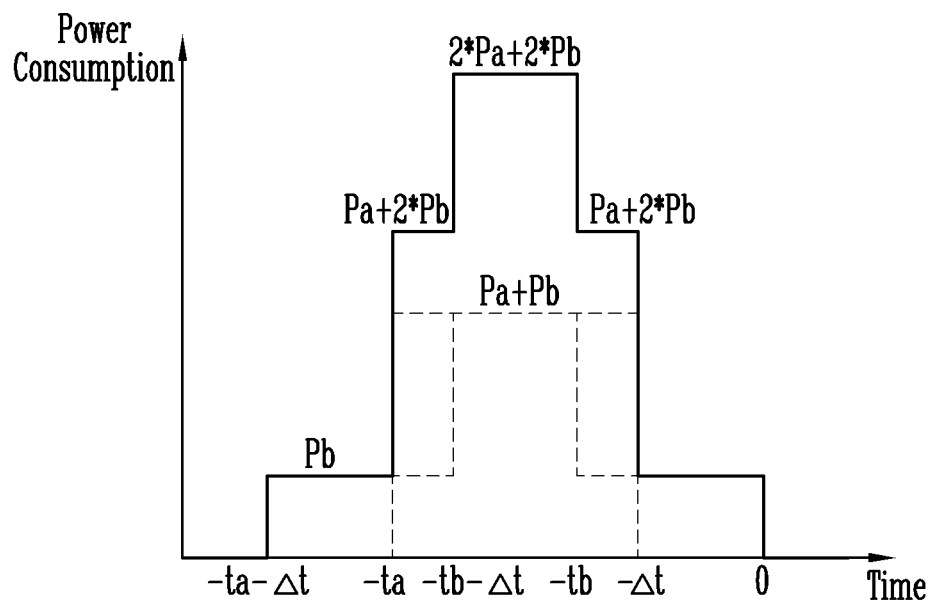
FIGS. 12A and 12B are diagrams illustrating a power consumption when a command of FIG. 10A is delayed in accordance with an embodiment of the disclosure.
Figure 12B:
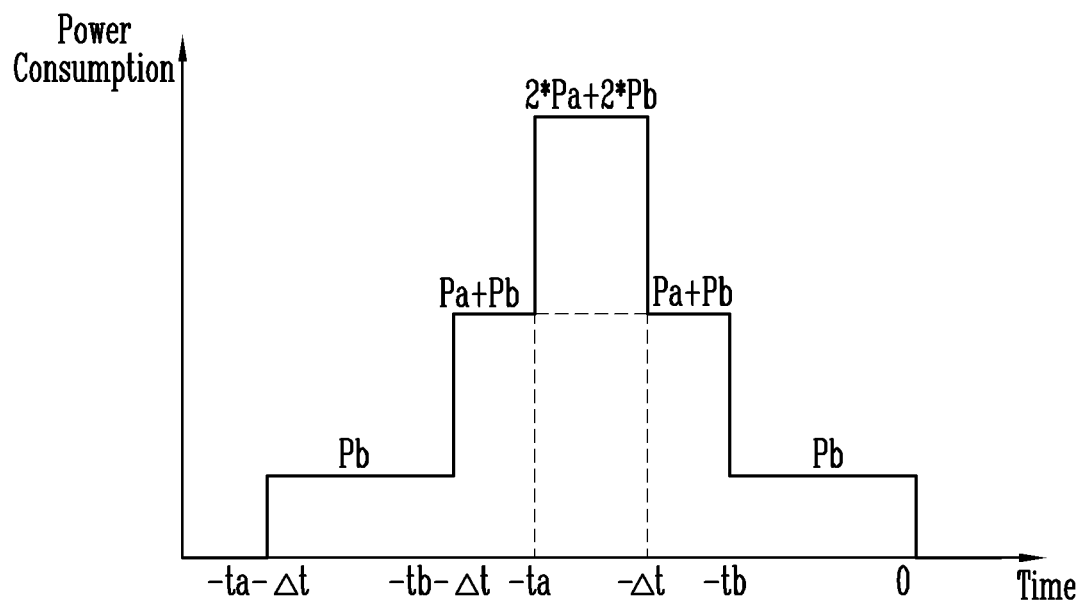

FIGS. 12A, and 12B are diagrams illustrating power consumption when a command of FIG. 10A is delayed in accordance with an embodiment of the present disclosure.

Referring to FIGS. 10A, 10B, 12A, and 12B, FIGS. 12A and 12B illustrate a summed power consumption obtained by summing power consumption required to perform the first and second commands after a command of FIG. 10A, i.e., the first command, has been delayed. In FIGS. 12A and 12B, the delay time Δt is expressed in the negative, as are both the first and second commands, such that the first command follows the second command, and the second command has a negative value but precedes the first command. FIGS. 12A and 12B consequently illustrate a summed power consumption obtained by summing power consumption needed to perform the first and second commands after the first command has been delayed.

In FIGS. 12A and 12B, the horizontal axis indicates the time for which a command is performed, and the vertical axis indicates the power consumption as a function of time.

The delay time Δt of the second command of FIG. 10B may be greater than −ta and less than 0. Therefore, the delay time Δt of the first command of FIG. 10A may be greater than 0 and less than ta.

The delay time −Δt of the first command cannot exceed ta in the negative direction. In other words, if the delay time −Δt of the first command exceeds −ta in the negative direction, then the delay time −Δt cannot be reduced because the first command is performed after the second command has been performed. Given this, it is assumed that the delay time −Δt does not exceed −ta.

Referring to FIGS. 10A, 10B, 12A, and 12B, FIGS. 12A and 12B illustrate a summed power consumption obtained by summing the power consumption required when the first command is delayed and the power consumption required when the second command is delayed. FIG. 12A illustrates the case where the delay time Δt of the second command is greater than −tb and less than 0. FIG. 12A illustrates the case where the delay time Δt of the first command is greater than 0 and less than tb. FIG. 12B illustrates the case where the delay time Δt of the second command is greater than −ta and less than −tb. FIG. 12A illustrates the case where the delay time Δt of the first command is greater than tb and less than ta.

In an embodiment, a power consumption required in a period between −ta−Δt and −ta of FIG. 12A may be Pb. In other words, since the first command has been delayed, the power consumption in the period between −ta−Δt and −ta may be a power consumption required to perform the second command of FIG. 10B.

In FIG. 12A, a power consumption in a period between −ta and −Δt may be a power consumption required to perform the first and second commands. In other words, the power consumption in the period between −ta and −Δt may be a power consumption required to perform the first and second commands after the delay time Δt has passed.

In detail and with reference to FIGS. 10A and 10B, a power consumption in a period between −ta and −tb−Δt may be Pa+2*Pb, a power consumption in a period between −tb−Δt and −tb may be 2*Pa+2*Pb, and a power consumption in a period between −tb and −Δt may be Pa+2*Pb. The power consumption required in the period between −ta and −tb−Δt may be Pa+2*Pb obtained by summing the power consumption Pb required to perform the first command and the power consumption Pa+Pb required to perform the second command. In other words, the power consumption required in the period between −tb−Δt and −tb may be 2*Pa+2*Pb obtained by summing the power consumption Pa+Pb required to perform the first command and the power consumption Pa+Pb required to perform the second command. In other words, the power consumption required in the period between −tb and −Δt may be Pa+2*Pb obtained by summing the power consumption Pa+Pb required to perform the first command and the power consumption Pb required to perform the second command.

The power consumption required in the period between −Δt and 0 of FIG. 12A may be Pb. In other words, since the first command has been delayed, the power consumption in the period between −Δt and 0 may be a power consumption required to perform the first command.

Consequently, in the case where the delay time Δt of the first command is greater than 0 and less than tb, the peak power consumption may be 2*Pa+2*Pb.

In an embodiment, a power consumption required in a period between −ta−Δt and −tb−Δt of FIG. 12B may be Pb, and a power consumption required in a period between −tb−Δt and −ta may be Pa+Pb. In other words, since the first command has been delayed, the power consumption in the period between −ta−Δt and −ta may be a power consumption required to perform the second command.

In FIG. 12B, a power consumption in a period between −ta and −Δt may be a power consumption required to perform the first and second commands. In other words, the power consumption in the period between −ta and −Δt may be a power consumption required to perform the first and second commands after the delay time Δt has passed. The power consumption required in the period between −ta and −Δt may be 2*Pa+2*Pb obtained by summing the power consumption Pa+Pb required to perform the first command and the power consumption Pa+Pb required to perform the second command.

In an embodiment, a power consumption required in a period between −Δt and −tb of FIG. 12B may be Pa+Pb, and a power consumption required in a period between −tb and 0 may be Pb. In other words, since the first command has been delayed, the power consumption in the period between −Δt and 0 may be a power consumption required to perform the first command.

Consequently, in the case where the delay time Δt of the first command is greater than tb and less than ta, the peak power consumption may be 2*Pa+2*Pb.

FIG. 12A illustrates a power consumption when a command of FIG. 10A, i.e., the first command, is delayed. Therefore, when the delay time Δt of the first command is greater than 0 and less than tb, the peak power consumption may be 2*Pa+2*Pb. In FIG. 12B, when the delay time Δt of the first command is greater than tb and less than ta, the peak power consumption may be 2*Pa+2*Pb. In other words, when the first command is delayed, the peak power consumption regardless of the delay time Δt may be 2*Pa+2*Pb.

Figure 13:
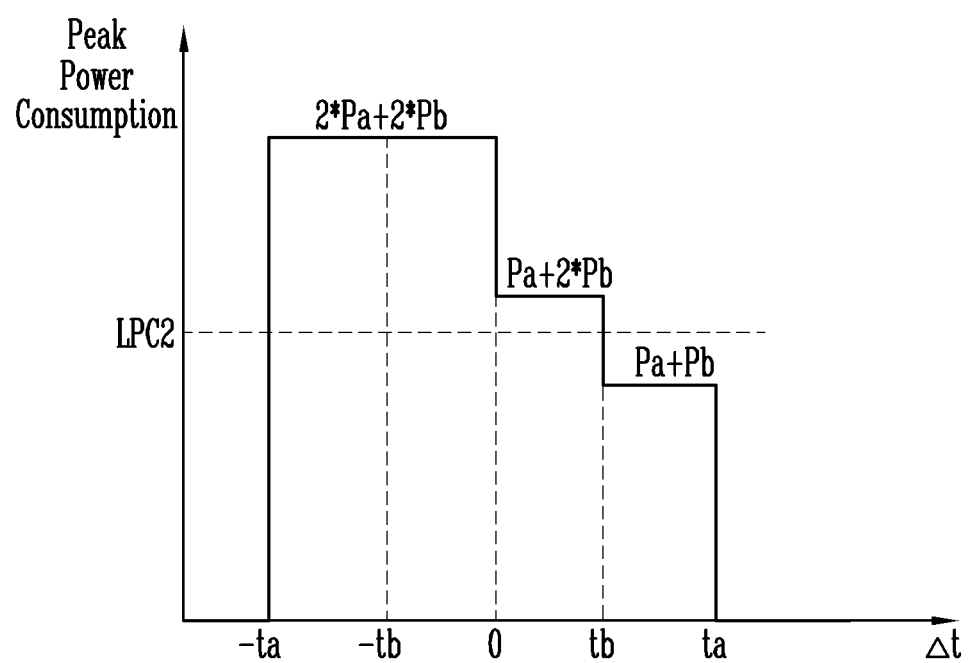
FIG. 13 is a diagram illustrating a peak power consumption when commands in FIGS. 10A and 10B are delayed in accordance with an embodiment of the present disclosure.

FIG. 13 is a diagram illustrating a peak power consumption when commands in FIGS. 10A and 10B are delayed in accordance with an embodiment of the present disclosure.

Referring to FIGS. 10A and 10B and FIG. 13, the horizontal axis of FIG. 13 indicates the delay time Δt of a command, and the vertical axis indicates the peak power consumption (PPC) required as a function of the delay time Δt. FIG. 13 illustrates the PPC required as a function of the delay time Δt based when a command of FIG. 10B, i.e., the second command, is delayed. If the delay time Δt is less than 0, the first command rather than the second command may be delayed.

In FIG. 13, it is assumed that the power mode of the memory device 100 and the memory controller 200 is a middle power mode ("MID_MODE"), and an LPC corresponding to the middle power mode is a second limit power consumption ("LPC2"). In other words, the power consumption required in the memory device 100 and the memory controller 200 cannot exceed the second limit power consumption LPC2.

In FIG. 13, it is also assumed that a summed power consumption 2*Pa+2*Pb required to perform the first and second commands exceeds the second limit power consumption LPC2.

Referring to FIGS. 12A, 12B and 13, in the case where the delay time Δt is greater than −ta and less than 0, the peak power consumption (PPC) may be 2*Pa+2*Pb. In other words, the peak power consumption required when the first command is delayed may be 2*Pa+2*Pb.

However, since the peak power consumption (PPC) 2*Pa+2*Pb required when the first command is delayed exceeds the second limit power consumption LPC2, the first command cannot be delayed.

In an embodiment, in the case where the PPC required when the first command is delayed does not exceed the second limit power consumption LPC2, the delay time Δt may be determined within a range from −ta to 0. Here, the fact that the delay time Δt is a negative number may mean that the first command is delayed. Therefore, the minimum absolute value making it possible for the PPC not to exceed the second limit power consumption LPC2 among the absolute values of the delay time Δt may be determined to be a delay time Δt of the fist command.

Referring to FIGS. 11A, 11B to 13, in the case where the delay time Δt is greater than 0 and less than tb, the PPC may be Pa+2*Pb. In the case where the delay time Δt is greater than tb and less than ta, the PPC may be Pa+Pb. In other words, the peak power consumption required when the second command is delayed may be Pa+2*Pb or Pa+Pb.

In an embodiment, since the PPC required when the delay time Δt is greater than 0 and less than tb is Pa+2*Pb, the PPC may exceed the second limit power consumption LPC2. Therefore, the delay time Δt cannot fall between 0 to tb.

In an embodiment, since the PPC required when the delay time Δt is greater than tb and less than ta is Pa+Pb, the PPC may not exceed the second limit power consumption LPC2. Therefore, the delay time Δt may be between tb to ta.

Consequently, the minimum delay time possible for the PPC not to exceed the second limit power consumption LPC2, from summed power consumption required to perform the first and second commands after the second command is delayed, may be determined so that Δt is at least tb. Therefore, in the case where the first and second commands are simultaneously performed, the second command may be output at a time delayed at a minimum by tb after the first command has been output.

Figure 14A:
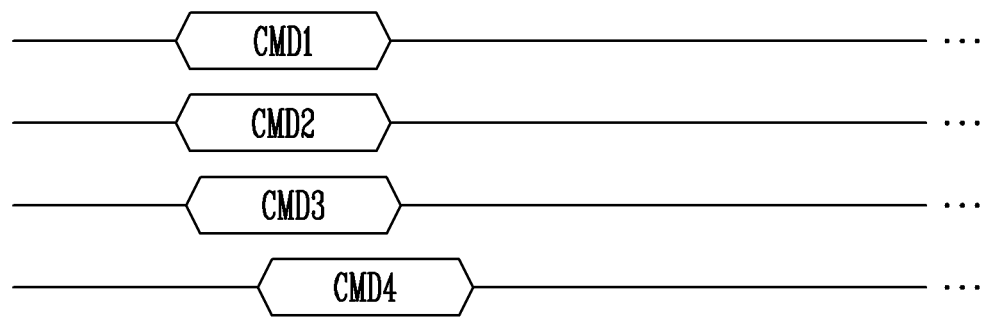
FIGS. 14A to 14C are diagrams illustrating a delay of a command when a summed power consumption exceeds a power consumption limit, in accordance with embodiments of the present disclosure.
Figure 14B:
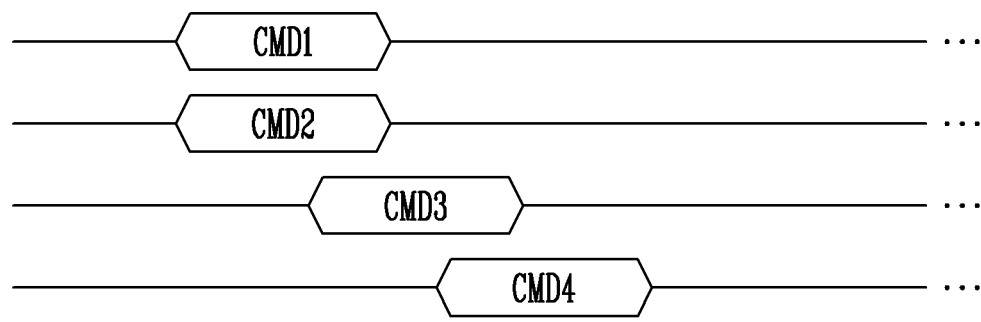
Figure 14C:
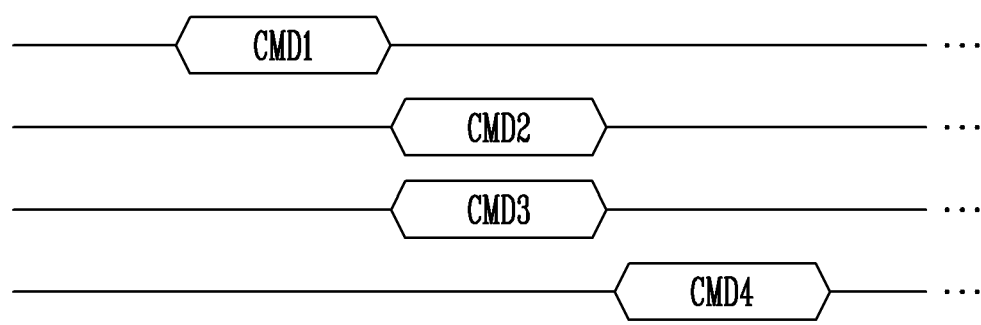

FIGS. 14A, 14B and 14C are diagrams illustrating a delay of a command when a summed power consumption exceeds an LPC in accordance with embodiments of the disclosure.

Specifically, FIGS. 14A to 14C illustrate commands which are delayed depending on power modes of the memory device 100 and the memory controller 200. FIG. 14A illustrates a delay of a command when the memory device 100 and the memory controller 200 are operated in the maximum power mode MAX_MODE, FIG. 14B illustrates delays of commands in the middle power mode MID_MODE, and FIG. 14C illustrates delays of commands in the minimum power mode MIN_MODE. When the power mode is the maximum power mode MAX_MODE, the LPC may be determined to be the first limit power consumption LPC1. When the power mode is the middle power mode MID_MODE, the LPC may be determined to be the second limit power consumption LPC2. When the power mode is the minimum power mode MIN_MODE, the LPC may be determined to the third limit power consumption LPC3.

In FIGS. 14A to 14C, it is assumed that first to fourth commands CMD1 to CMD4 are commands which are respectively performed in first to fourth dies DIE1 to DIE4 included in the memory device 100. Each of the first to fourth commands CMD1 to CMD4 may be any one of a program command for performing a program operation, a read command for performing a read operation, or an erase command for performing an erase operation.

In an embodiment, FIG. 14A illustrates a command which is performed on each die in the maximum power mode MAX_MODE.

In detail, commands may be simultaneously performed on the first to fourth dies DIE1 to DIE4. However, a summed power consumption obtained by summing PPCs required to perform commands may exceed the first limit power consumption LPC1. When the summed power consumption exceeds the first limit power consumption LPC1, any one of the first to fourth commands CMD1 to CMD4 may be delayed.

As an example, when the fourth command CMD4 among the first to fourth commands CMD1 to CMD4 is delayed, the summed power consumption obtained by summing the PPCs may not exceed the first limit power consumption LPC1. Therefore, when the fourth command CMD4 is delayed, delay times may be determined based on the summed power consumptions. Thereafter, a minimum delay time corresponding to a summed power consumption that does not exceed the first limit power consumption LPC1 may be determined or calculated.

Consequently, in FIG. 14A, after the first to third commands CMD1 to CMD3 have been performed on the first to third dies DIE3, the fourth command CMD4, which is delayed, is performed with a minimum delay time within a range such that the peak power consumption may be prevented from exceeding the first limit power consumption LPC1.

In an embodiment, FIG. 14B illustrates a command which is performed on each die in the middle power mode MID_MODE.

In detail, commands may be simultaneously performed on the first to fourth dies DIE1 to DIE4. However, a summed power consumption obtained by summing PPC required to perform commands may exceed the second limit power consumption LPC2. When the summed power consumption exceeds the second limit power consumption LPC2, any one of the first to fourth commands CMD1 to CMD4 may be delayed.

As an example, even when the fourth command CMD4 among the first to fourth commands CMD1 to CMD4 is delayed, the summed power consumption obtained by summing the PPC may still exceed the second limit power consumption LPC2. In this case, any one of the first to third commands CMD1 to CMD3 may also be delayed.

If the third and fourth commands CMD3 and CMD4, among the first to fourth commands CMD1 to CMD4 are delayed, then the summed power consumption obtained by summing the PPC may not exceed the second limit power consumption LPC2. Therefore, when the third and fourth commands CMD3 and CMD4 are delayed, a minimum delay time generating a summed power consumption not exceeding the second limit power consumption LPC2 may be used.

Consequently, in FIG. 14B, after the first and second commands CMD1 and CMD2 have been performed on the first and second dies DIE1 and DIE2, the third and fourth commands CMD3 and CMD4 are delayed. The third and fourth commands CMD3 may be performed with a minimum delay time within a range such that the peak power consumption among the determined summed power consumption may be prevented from exceeding the second limit power consumption LPC2.

In another example, if the third command CMD3 has been performed after the first and second commands CMD1 and CMD2 are completed, then it may be determined whether a summed power consumption obtained by summing PPC for commands to be performed after the operations have been completed exceeds the second limit power consumption LPC2. If the summed power consumption does not exceed the second limit power consumption LPC2, then the fourth command CMD may be performed immediately after the operation of performing the first and second commands CMD1 and CMD2 have been performed. If the summed power consumption exceeds the second limit power consumption LPC2, a minimum delay time making a summed power consumption not exceed the second limit power consumption LPC2 may be redetermined from summed power consumption determined by delay times.

In an embodiment, FIG. 14C illustrates a command which is performed on each die in the minimum power mode MIN_MODE.

In detail, commands may be simultaneously performed on the first to fourth dies DIE1 to DIE4. However, a summed power consumption obtained by summing PPC required to perform commands may exceed the third limit power consumption LPC3. When the summed power consumption exceeds the third limit power consumption LPC3, any one of the first to fourth commands CMD1 to CMD4 may be delayed.

When the second to fourth commands CMD2 to CMD4 among the first to fourth commands CMD1 to CMD4 are delayed, the summed power consumption obtained by summing the PPC may not exceed the third limit power consumption LPC3. Therefore, the first command CMD1 may be performed first. Since the power mode is the minimum power mode MIN_MODE, the only problem is whether a command has been delayed, regardless of a delay time of the command.

If the operation of performing the first command CMD1 is completed, then it may be determined whether a summed power consumption obtained by summing PPC required to perform the second to fourth commands CMD2 to CMD4 exceeds the third limit power consumption LPC3. In an embodiment, the fourth command CMD4 is delayed so that the summed power consumption obtained by summing the PPC does not exceed the third limit power consumption LPC3. Therefore, the second and third commands CMD3 may be performed before the fourth command CMD4.

If the operations of performing the second and third commands CMD2 and CMD3 are completed, it may be determined whether a summed power consumption obtained by summing PPC required to perform the other commands exceeds the third limit power consumption LPC3. In an embodiment, since only the fourth command CMD4 is required to be performed, the fourth command CMD4 may be performed after the operations of performing the second and third commands CMD2 and CMD3 have been completed.

Figure 15:
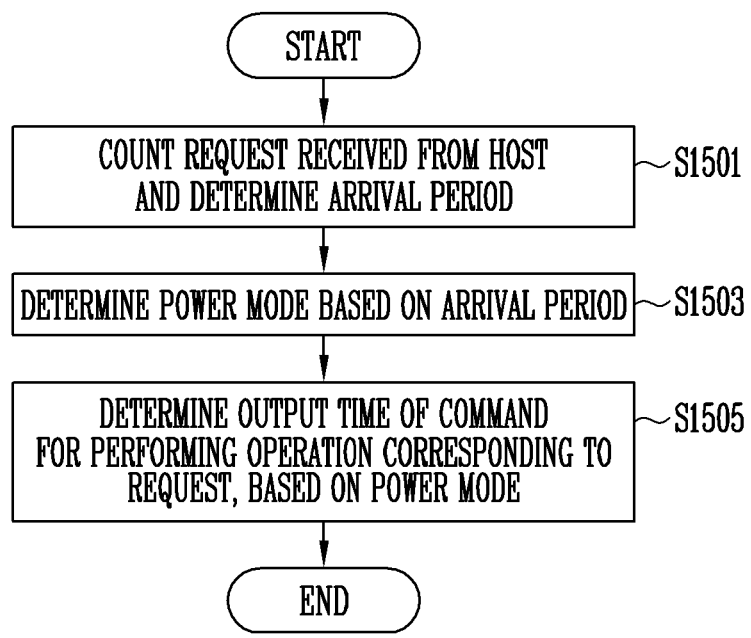
FIG. 15 is a diagram for describing an operation of a memory controller in accordance with an embodiment of the present disclosure.

FIG. 15 is a diagram for describing an operation of a memory controller 200 in accordance with an embodiment of the present disclosure.

Referring to FIG. 15, at step S1501, the memory controller 200 may count requests received from the host 300 and determine an arrival period ARV_PERIOD.

In detail, the memory controller 200 may receive requests from the host 300. Each of the requests received from the host 300 may be a program request, a read request, an erase request, or a power mode setting request PMSET_REQ.

The memory controller 200 may generate a count value by counting the number of requests received from the host 300. Here, the power mode setting request PMSET_REQ may be excluded from the counts to be counted by the memory controller 200. In other words, the memory controller 200 may count requests other than the power mode setting request PMSET_REQ among the requests received from the host 300.

The memory controller 200 may determine an arrival period ARV_PERIOD based on the count value. The arrival period ARV_PERIOD may be a period between a point in time at which the count value is generated and a point in time at which the count value matches the preset reference value.

At step S1503, the memory controller 200 may determine a power mode based on the arrival period ARV_PERIOD. The power mode determined at step S1503 may be an optimal power mode of the memory device 100 and the memory controller 200. The peak power consumption (PPC) required in the memory device 100 and the memory controller 200 may be determined based on the power mode. The PPC may correspond to a limit power consumption (LPC).

At step S1505, the memory controller 200 may determine a point in time at which a command for an operation corresponding to a request is output, based on the power mode. In other words, the memory controller 200 may determine points in time at which the commands for performing the operations corresponding to the respective requests received from the host 300 are output, based on the power mode.

In detail, if the power mode of the memory device 100 and the memory controller 200 is determined, then an LPC corresponding to the power mode may be determined. The LPC may be the maximum of power that can be consumed in the memory device 100 and the memory controller 200.

The memory controller 200 may compare a summed power consumption required to perform commands with the LPC. If the summed power consumption exceeds the LPC, then the memory controller 200 may determine to delay at least one of the commands and determine a delay time of the corresponding command, i.e., a point in time at which the command is output.

Figure 16:
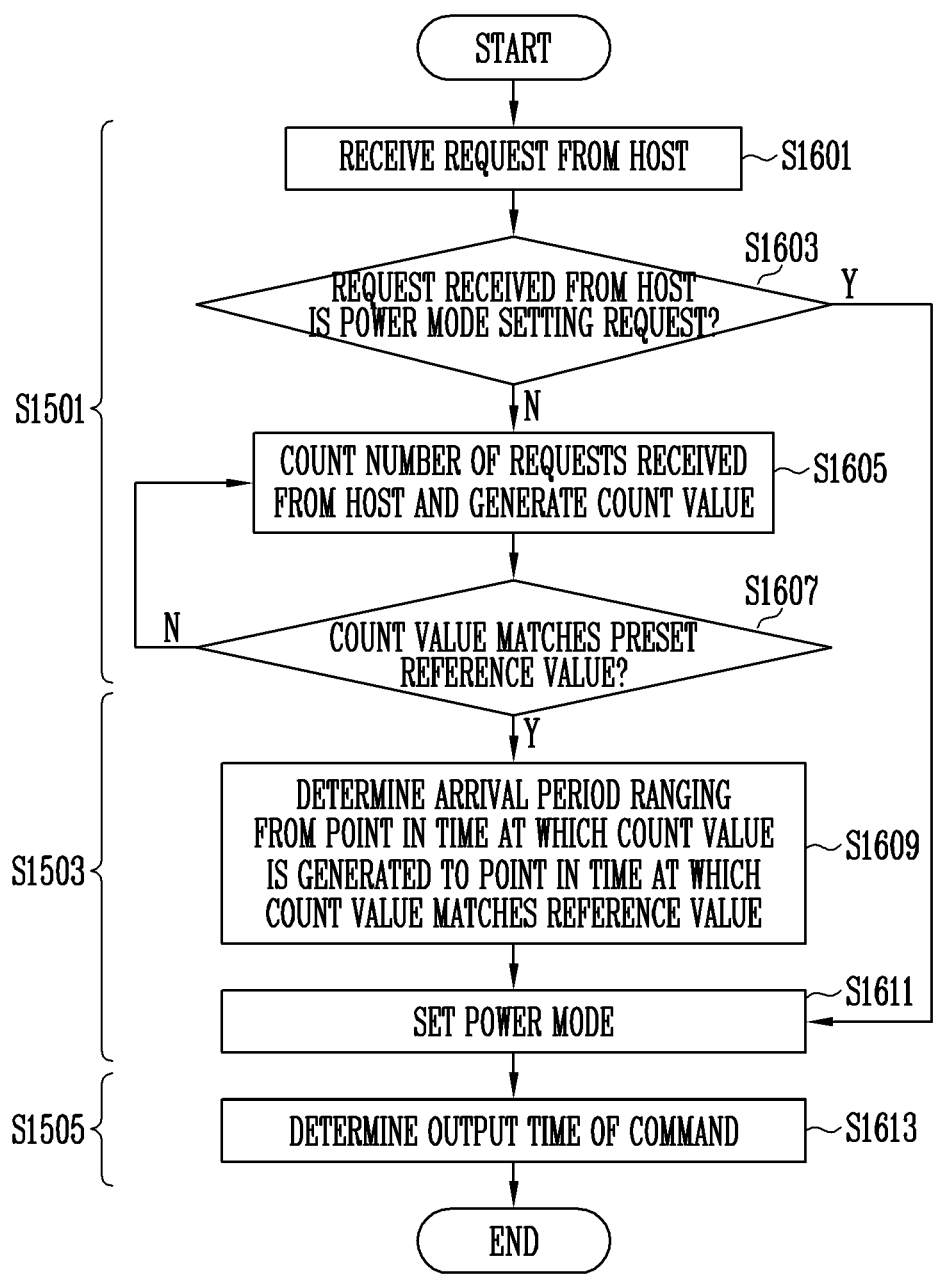
FIG. 16 is a diagram illustrating an operation of a memory controller in accordance with an embodiment of the present disclosure.

FIG. 16 is a diagram for describing an operation of a memory controller 200 in accordance with an embodiment of the present disclosure.

Referring to FIGS. 15 and 16, steps S1601 to S1607 may be steps performed in step S1501. Steps S1609 and S1611 may be steps performed in step S1503. Step S1613 may be substantially the same or the same as step S1505.

In detail, at step S1601, the memory controller 200 may receive requests from the host 300. Each of the requests received from the host 300 may be a program request, a read request, an erase request, or a power mode setting request PMSET_REQ.

The program request, the read request, or the erase request may be a request for performing an operation on at least one die included in the memory device 100. In other words, the program request, the read request, or the erase request may be a request for an operation to be performed on only one die or a request for an operation to be performed on a plurality of dies.

The power mode setting request PMSET_REQ may be a request for setting the power mode of the memory device 100 and the memory controller 200. In other words, the power mode setting request PMSET_REQ may be a request for setting the LPC of the memory device 100 and the memory controller 200 rather than being a request for performing an operation on the memory device 100. The memory controller 200 may receive the power mode setting request PMSET_REQ from the host 300 and set the power mode of the memory device 100 and the memory controller 200.

At step S1603, the memory controller 200 may determine whether a request received from the host 300 is a power mode setting request PMSET_REQ. If the request received from the host 300 is not a power mode setting request PMSET_REQ, the process may proceed to step S1605. If the request received from the host 300 is a power mode setting request PMSET_REQ, the process may proceed to step S1611.

At step S1605, the memory controller 200 may generate a count value by counting the number of requests received from the host 300. The memory controller 200 may count the number of requests other than the power mode setting request PMSET_REQ. The memory controller 200 may accumulate and count the number of requests. The memory controller 200 may generate a count value by counting the number of requests. Depending on the count value generated by the memory controller 200, the optimal power mode of the memory device 100 and the memory controller 200 may be determined.

At step S1607, the memory controller 200 may determine whether the count value matches a preset reference value. The count value may be generated by counting the number of requests received from the host 300. Since the count value is generated by accumulating the requests, the count value may increase up to the preset reference value. If the count value matches the present reference value, the process proceeds to step S1609. If the count value does not match the preset reference value, then the process proceeds to step S1605, until the count value matches the preset reference value.

At step S1609, the memory controller 200 may determine an arrival period ARV_PERIOD, which is a period between a point in time at which the counter value is generated and a point in time at which the count value matches the preset reference value. The memory controller 200 may calculate the arrival period ARV_PERIOD to determine the power mode. In other words, the optimal power mode of the memory device 100 and the memory controller 200 may be based on the arrival period ARV_PERIOD.

At step S1611, the memory controller 200 may determine or set a power mode. The power mode may be determined based on the arrival period ARV_PERIOD or the power mode setting request PMSET_REQ received from the host 300. Here, the determined power mode may be an optimal power mode of the memory device and the memory controller.

In detail, as the arrival period ARV_PERIOD is increased, the LPC to be determined in the power mode that is determined to be the optimal power mode of the memory device 100 and the memory controller 200 by the memory controller 200 may be reduced. Furthermore, as the arrival period ARV_PERIOD is reduced, the LPC to be determined in the power mode that is determined to be the optimal power mode of the memory device 100 and the memory controller 200 by the memory controller 200 may be increased. The LPC may be the maximum power that can be consumed in the memory device 100 and the memory controller 200.

In an embodiment, the memory controller 200 may determine the power mode setting request PMSET_REQ. In other words, the memory controller 200 may receive, from the host 300, a power mode setting request PMSET_REQ for determining the power mode of the memory device 100 and the memory controller 200, and then determine the power mode of the memory device 100 and the memory controller 200 based on the power mode setting request PMSET_REQ.

At step S1613, the memory controller 200 may determine a point in time at which a command is output. In an embodiment, if a summed power consumption required to perform commands is equal to or less than the LPC, commands may be simultaneously output to the memory device 100. If the summed power consumption is greater than the LPC, the commands may not be simultaneously output, and at least one of the commands may be delayed.

Figure 17:
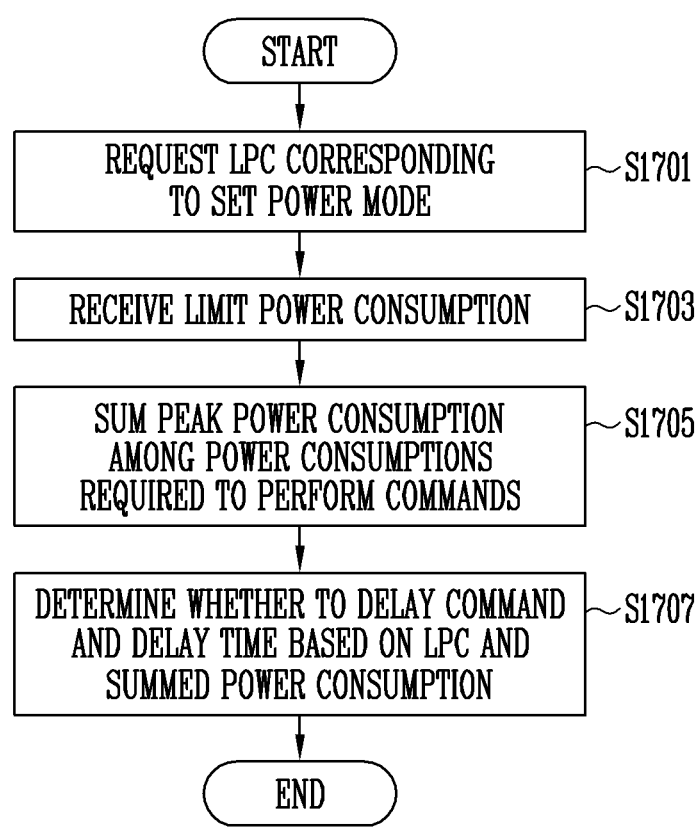
FIG. 17 is a diagram illustrating an operation of a memory controller in accordance with an embodiment of the present disclosure.

FIG. 17 is a diagram for describing an operation of a memory controller 200 in accordance with an embodiment of the present disclosure.

Referring to FIG. 17, at step S1701, the memory controller 200 may request an LPC corresponding to the set power mode (e.g., the command delay determiner 233 may provide an LPC request LPC_REQ to the limit power management table 231 based on the power mode setting information PMSET_INF). The power mode may be determined based on the arrival period ARV_PERIOD or the power mode setting request PMSET_REQ received from the host 300. The LPC may be the maximum of power that can be consumed in the memory device 100 and the memory controller 200.

At step S1703, the memory controller 200 may receive the LPC (e.g., an LPC corresponding to a power mode in the limit power management table 231 may be provided to the command delay determiner 233). The LPC may be received from the limit power management table. The limit power management table may include information about the LPC. The limit power management table may include information about the LPC corresponding to the power mode determined by the power mode setting circuit 220. Information about LPCs corresponding to various power modes may be included in the limit power management table. Hence, the limit power management table may include information about various LPCs.

In an embodiment, the memory controller 200 may receive the LPC corresponding to the power mode. After having received the LPC, the memory controller 200 may compare the LPC and a summed power consumption obtained by summing PPC required to perform commands, and generate a result of the comparison.

At step S1705, the memory controller 200 may sum the PPC required to perform the commands. In an embodiment, when the memory device performs a command, the power consumption as a function of time may be changed in various ways. However, since the power consumption of the memory device 100 and the memory controller 200 is limited, the memory controller 200 may sum the PPC required to perform commands and determine whether the summed power consumption exceeds the LPC.

At step S1707, the memory controller 200 may determine whether to delay a command or a delay time based on the LPC and the summed power consumption.

In an embodiment, if the summed power consumption is equal to or less than the LPC, the memory controller 200 may determine that all of the commands are to be performed. In other words, the memory controller 200 may determine that a command is not delayed.

In an embodiment, if the summed power consumption is greater than the LPC, the memory controller 200 may determine to delay at least one of the commands. The delay time may be the least delay time possible such that a summed power consumption does not exceed the LPC.

Figure 18:
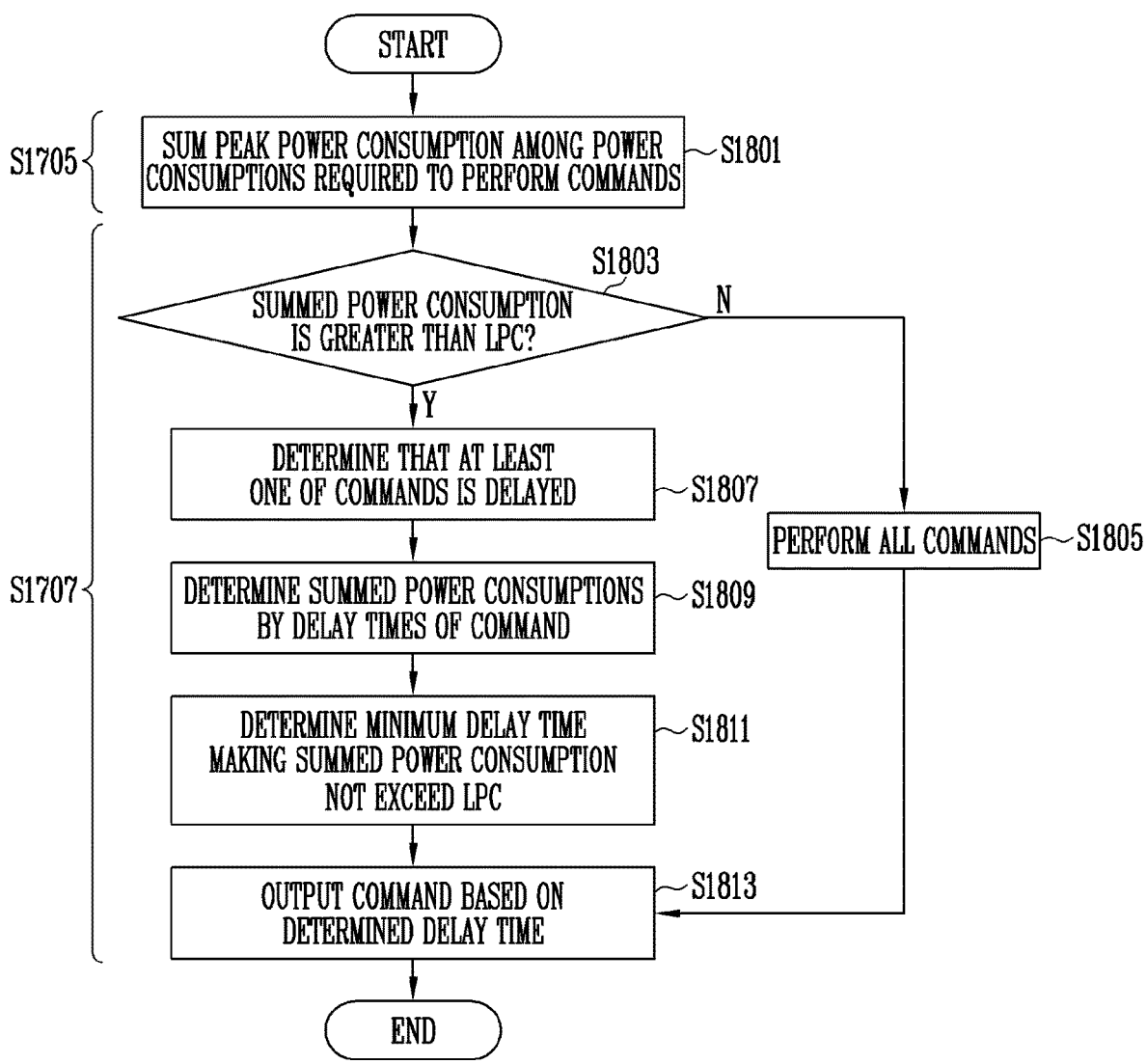
FIG. 18 is a diagram illustrating an operation of a memory controller in accordance with an embodiment of the present disclosure.

FIG. 18 is a diagram for describing an operation of a memory controller 200 in accordance with an embodiment of the present disclosure.

Referring to FIGS. 17 and 18, step S1801 and step S1705 are the same or substantially the same as each other. Steps S1803 to S1813 may be steps that further clarify or illustrate step S1707.

At step S1801, the memory controller 200 may sum PPC required to perform commands. The memory controller 200 may determine whether to delay a command and a delay based on a summed power consumption obtained by summing the PPC. In other words, since the power consumption of the memory device 100 and the memory controller 200 is limited, the memory controller 200 may sum the PPC required to perform commands and determine whether the summed power consumption exceeds the LPC.

At step S1803, the memory controller 200 may determine whether the summed power consumption is greater than the LPC. The LPC may be determined depending on the power mode. The LPC may be the maximum power that can be consumed in the memory device 100 and the memory controller 200. In a case where the summed power consumption is not greater than the LPC, i.e., if the summed power consumption is equal to or less than the LPC, the process proceeds to step S1805. In a case where the summed power consumption is greater than the LPC, the process proceeds to step S1807.

At step S1805, the memory controller 200 may perform all commands if the summed power consumption is equal to or less than the LPC. In other words, since the summed power consumption does not exceed the maximum power that can be consumption in the memory device 100 and the memory controller 200, the memory controller 200 may determine that all of the commands are to be performed without delay. In this case, the memory controller 200 may determine that no commands are delayed.

At step S1807, the memory controller 200 may determine that at least one of the commands is delayed. In an embodiment, since the peak power consumption required to perform the commands is greater than the LPC, the memory controller 200 may determine to delay at least one of the commands. In other words, if all of the commands are performed, then the power consumption of the memory device 100 and the memory controller 200 would exceed the LPC. Therefore, at least one of the commands may be delayed.

At step S1809, the memory controller 200 may determine summed power consumption by delay times of the command. In other words, when any one of the commands is delayed, the memory controller 200 may sum power consumption by delay times. That is, the memory controller 200 may sum power consumption at each time section determined by the delay time.

In an embodiment, if all of the summed power consumption exceeds the LPC, the memory controller 200 may delay another one of the commands. In other words, if all of the summed power consumption exceeds the LPC, the memory controller 200 may additionally delay one of the commands and redetermine a delay time based on summed power consumption by delay times. The memory controller 200 may delay commands until the summed power consumption by delay times does not exceed the LPC.

At step S1811, the memory controller 200 may determine a minimum delay time that results in summed power consumption that do not exceed the LPC. In other words, the memory controller 200 may determine points in time at which the commands for performing the operations corresponding to the respective requests received from the host 300 are output, based on the power mode, in order not to exceed the LPC.

In detail, the power consumption summed based on the delay time may be greater than the LPC or less than the LPC. Therefore, the memory controller 200 may determine a minimum time among the delay times making the summed power consumption not exceed the LPC, to minimize delay time and to minimize the total time required for performing all commands.

At step S1813, the memory controller 200 may output a command at a point in time based on the determined delay time. In an embodiment, if the memory controller 200 determines to delay the command, the command that is determined to be delayed may be output at the determined delay time. In an embodiment, if the summed power consumption is equal to or less than the LPC, then the memory controller 200 may simultaneously execute all commands. The commands may be processed by a plurality of dies.

Figure 19:
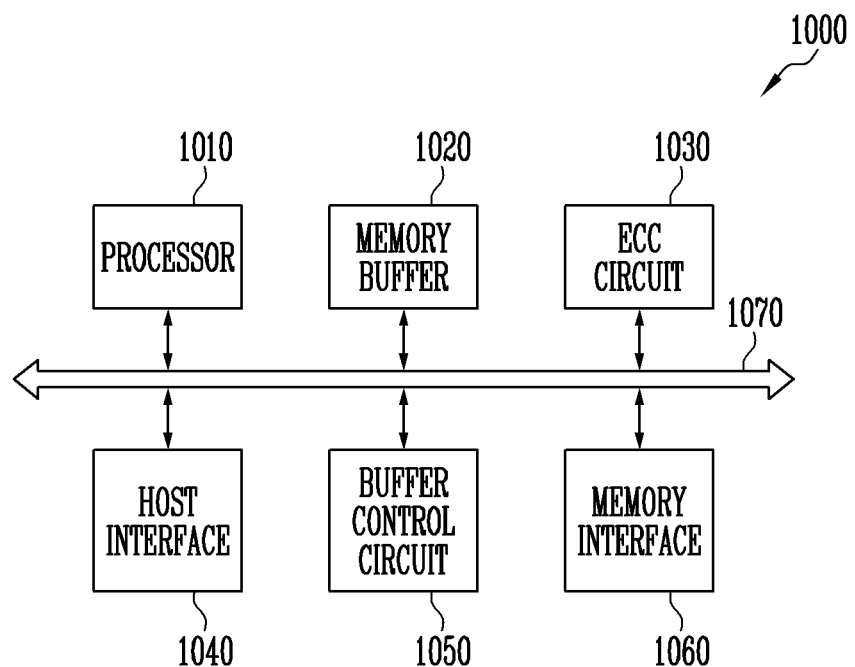
FIG. 19 is a diagram illustrating an example of a memory controller of FIG. 1 in accordance with an embodiment of the present disclosure.

FIG. 19 is a diagram illustrating an example of a memory controller of FIG. 1 in accordance with an embodiment of the present disclosure.

A memory controller 1000 is coupled to a host and a memory device. In response to a request from the host, the memory controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

Referring to FIG. 19, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and may communicate with the memory device through the memory interface 1060. In addition, the processor 1010 may communicate with the memory buffer 1020 through the buffer control circuit 1050. The processor 1010 may control the operation of the storage device by using the memory buffer 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

During a read operation, the processor 1010 may derandomize data received from the memory device. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

The memory buffer 1020 may be used as an operating memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device through the channel.

For example, the memory controller 1000 may include neither the memory buffer 1020 nor the buffer control circuit 1050.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 20:
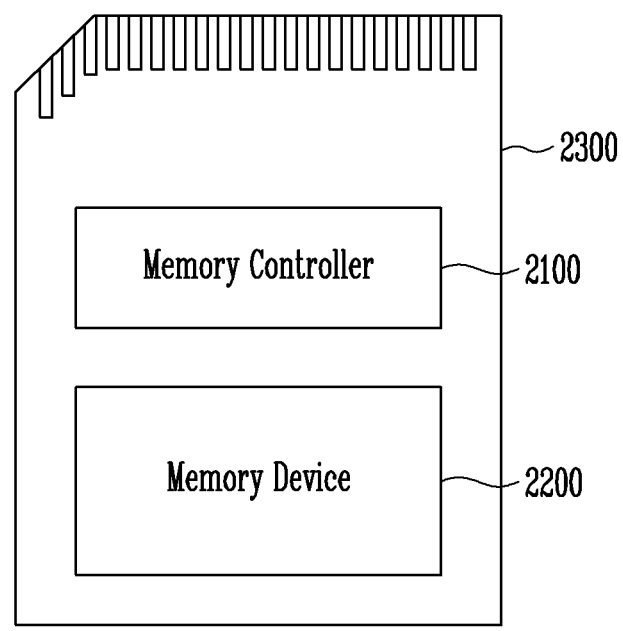
FIG. 20 is a block diagram illustrating a memory card system utilizing a storage device in accordance with an embodiment of the present disclosure.

FIG. 20 is a block diagram illustrating a memory card system utilizing a storage device in accordance with an embodiment of the present disclosure.

Referring FIG. 20, the memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2100 and the host. The memory controller 2100 may drive firmware for controlling the memory device 2200. The memory device 2200 may be embodied in the same manner as that of the memory device 100 described with reference to FIG. 2.

In an embodiment, the memory controller 2100 may include components such as a random access memory (RAM), a processing unit, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

Figure 21:
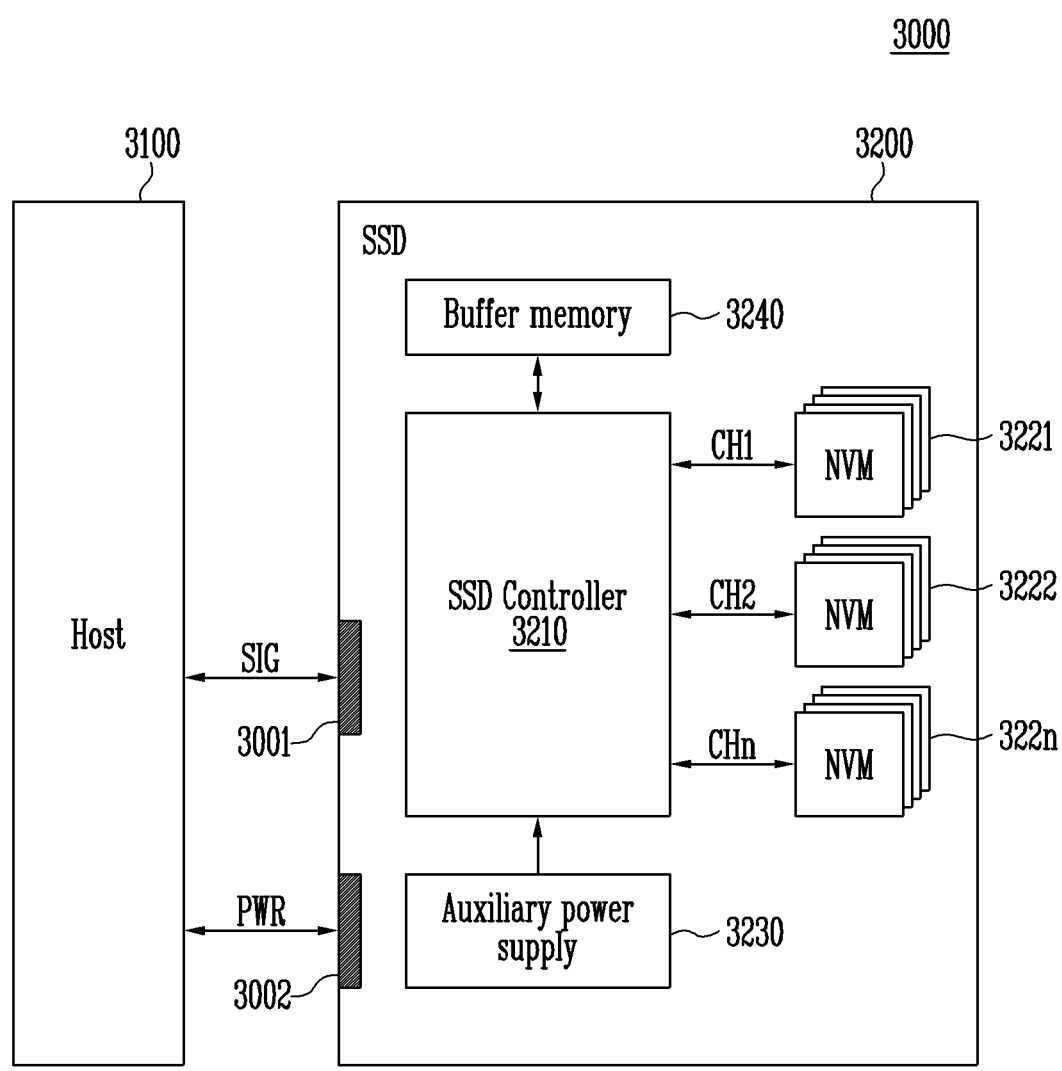
FIG. 21 is a block diagram illustrating a solid state drive (SSD) system that uses a storage device in accordance with an embodiment of the present disclosure.

FIG. 21 is a block diagram illustrating a solid state drive (SSD) system that uses a storage device in accordance with an embodiment of the present disclosure.

Referring to FIG. 21, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 22:
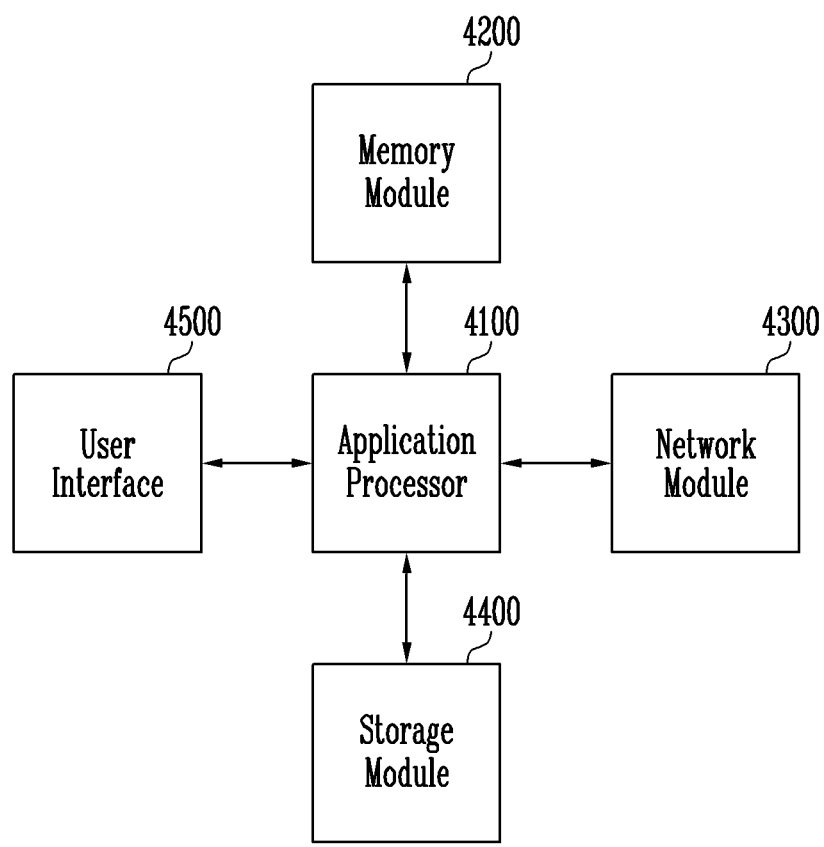
FIG. 22 is a block diagram illustrating a user system using a storage device in accordance with an embodiment of the present disclosure.

FIG. 22 is a block diagram illustrating a user system using a storage device in accordance with an embodiment of the present disclosure.

Referring to FIG. 22, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or WI-FI communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

For example, the storage module 4400 may include a plurality of nonvolatile memory devices. The storage module 4400 may be operated in the same manner as that of the storage device 50 described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a liquid crystal display (LCD), an organic light emitting diode (OLED) display device, an active matrix OLED (AMOLED) display device, an LED, a speaker, and a motor.

Various embodiments of the present disclosure may provide a memory controller and a method of operating the memory controller which is configured to determine whether to delay a command and a delay time based on a limit power consumption of a storage device.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not be always performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A computer memory storage device with a memory device having computer executable instructions embedded therein and having a memory controller that, when executing commands to control the memory device, performs a method of reducing computer processing time by increasing power consumed by the memory device and the memory controller in executing the commands, the computer memory storage device comprising:
    a memory controller circuit having
        a request counter to count a number of requests received from a host and to calculate an arrival period;
        power mode setting circuit configured to use the arrival period to select a maximum power mode for the memory device and the memory controller from among a plurality of power modes; and
        a command controller having a limit power management table with the plurality of power modes and determining a delay period for performing one or more of the received requests,
    wherein the arrival period is a period between a point in time at which counting begins to a point in time at which the number of requests matches a reference value, and
    wherein the computer memory storage device minimizes the amount of time to process the received requests under the selected power mode.

2. The computer memory storage device according to claim 1, wherein the power mode setting circuit includes
    a power mode table with a plurality of arrival periods corresponding to a plurality of power modes, and
    a plurality of limit power consumption values that are used to limit power consumed by the memory device and the memory controller.

3. The computer memory storage device according to claim 2, wherein the power mode setting circuit selects a power mode from the power mode table setting the limitation of power consumption to process the received requests under the selected power mode.

4. The computer memory storage device according to claim 3,
    wherein the power mode setting circuit selects a first power mode for a first arrival period,
    wherein the power mode setting circuit selects a second power mode for a second arrival period,
    wherein the first arrival period is greater than the second arrival period, and
    wherein the first power mode corresponds to a lower power consumption and the second power mode corresponds to a higher power consumption.

5. The computer memory storage device according to claim 1, wherein the command controller further comprises:
    a limit power management table including information about a limit power consumption corresponding to an optimal power mode;
    a command delay determiner configured to generate a delay information for at least one of the requests and a delay time depending on the limit power consumption; and
    a command output circuit configured to output a command based on the delay information,
    wherein the limit power consumption is a peak power consumption of the memory device and the memory controller.

6. The computer memory storage device according to claim 5, wherein the command delay determiner compares the limit power consumption with a summed power consumption obtained by summing peak power consumption required to perform the commands, and determines whether to delay at least one of the commands for a delay time.

7. The computer memory storage device according to claim 6, wherein, if the summed power consumption is greater than the limit power consumption, the command delay determiner determines to delay at least one of the commands.

8. The computer memory storage device according to claim 6, wherein, if the summed power consumption is equal to or less than the limit power consumption, the command delay determiner determines to perform all of the commands.

9. The computer memory storage device according to claim 7, wherein the command delay determiner determines summed power consumption by delay times when at least one of the commands is delayed.

10. The computer memory storage device according to claim 9, wherein the command delay determiner determines a minimum delay time generating a summed power consumption not exceeding the limit power consumption.

11. A method of operating a memory controller configured to control a memory device, the method comprising:
receiving requests from a host;
generating a count value by counting the number of requests received from the host;
calculating an arrival period that is a period between a point in time at which the count value is generated and a point in time at which the count value matches a preset reference value;
determining a delay period for performing one or more of the received requests;
determining a highest power mode corresponding to the memory device and the memory controller among a plurality of power modes in a table using the arrival period; and
increasing the power consumption to the highest power mode permitted for performing operations corresponding to the respective requests received to the memory device from the host,
wherein the computer memory storage device minimizes the amount of time to process the received requests under the selected power mode.

12. The method according to claim 11, wherein the determining a highest power mode comprises:
determining that, in a longer arrival period, a power mode by which a lower power consumption is determined to be a limit power consumption among the plurality of power modes is an optimal power mode, the limit power consumption being a power consumption that is a peak value power capable of being consumed in the memory device and the memory controller; and
determining that, in a shorter arrival period, a power mode by which a higher power consumption is determined to be the limit power consumption from the plurality of power modes is the optimal power mode.

13. The method according to claim 11, further comprising determining of a plurality of points in time at which the commands are output comprises requesting and receiving information about a limit power consumption corresponding to the optimal power mode,
wherein the limit power consumption is a peak value power capable of being consumed in the memory device and the memory controller.

14. The method according to claim 13, wherein the determining of points in time at which the commands are output further comprises:
comparing the limit power consumption with a summed power consumption obtained by summing peak power consumption required to perform the commands, and generating a result of the comparison; and
determining whether to delay at least one of the commands for a delay time depending on the result of the comparison.

15. The method according to claim 14, wherein the determining of whether to delay at least one of the commands for the delay time comprises delaying at least one of the commands if the summed power consumption is greater than the limit power consumption.

16. The method according to claim 14, wherein the determining of whether to delay at least one of the commands for the delay time comprises determining whether to perform all of the commands if the summed power consumption is equal to or less than the limit power consumption.

17. The method according to claim 15, wherein the determining of whether to delay at least one of the commands for the delay time comprises re-determining summed power consumption when at least one of the commands is delayed.

18. The method according to claim 17, wherein the determining of whether to delay at least one of the commands and the delay time comprises determining a minimum delay time generating a summed power consumption not exceeding the limit power consumption.

19. The method according to claim 17, wherein the determining of whether to delay at least one of the commands for the delay time comprises delaying one of the commands if the summed power consumption determined by the delay times exceeds the limit power consumption, and determining a delay time based on the summed power consumption.

* * * * *